United States Patent [19]

Phillips

[11] Patent Number: 4,676,649
[45] Date of Patent: Jun. 30, 1987

[54] MULTI-AXIS GAS BEARING STAGE ASSEMBLY

[75] Inventor: Edward H. Phillips, Middleton, Calif.

[73] Assignee: Compact Spindle Bearing Corp., Middletown, Calif.

[21] Appl. No.: 802,772

[22] Filed: Nov. 27, 1985

[51] Int. Cl.$^4$ ............................................. G01B 11/00
[52] U.S. Cl. ................................... 356/401; 250/548; 355/53; 356/358; 356/363; 33/1 M
[58] Field of Search .............. 356/358, 363, 399, 400, 356/401; 355/53; 250/548; 33/1 M; 384/12

[56] References Cited

U.S. PATENT DOCUMENTS

| | | | |
|---|---|---|---|
| 3,722,996 | 3/1973 | Fox | 355/53 |
| 3,786,332 | 1/1974 | Hepner et al. | 356/363 |
| 3,791,739 | 2/1974 | Kawasaki | 356/363 |
| 4,311,390 | 1/1982 | Phillips | 356/358 |
| 4,464,030 | 8/1984 | Gale et al. | 355/53 |
| 4,583,847 | 4/1986 | Battig et al. | 355/53 |

*Primary Examiner*—F. L. Evans
*Attorney, Agent, or Firm*—Joseph H. Smith

[57] ABSTRACT

An improved multi-axis gas bearing stage assembly is disclosed which has a base, an intermediate stage element, a stage, and a control system for controlling the movement of the intermediate stage element and the stage. The control system includes first and second Y-axes positioning sub-systems for differentially positioning first and second ends of the intermediate stage element along first and second Y-axes of motion, with respect to the base, and an $X_i$-axis positioning sub-system for positioning the stage along an $X_i$-axis of motion, with respect to the intermediate stage element. In one embodiment, the positioning sub-systems comprise motor-encoder driven leadscrews. In a second embodiment, the positioning sub-systems comprise linear motors, measuring scales, and read heads. In a third embodiment, the positioning sub-systems comprise linear motors and interferometer measuring systems. A method of achieving orthogonality between the Y- and $X_i$-axes that features an orthogonality alignment standard is disclosed. In a another embodiment, the differential positioning capability of the first and second Y-axes is utilized for positioning the intermediate stage element along a $\theta$-axis about a Z-direction orthogonal to both the Y- and X-axes, and a method of rotationally aligning a semiconductive wafer is disclosed. In other embodiments, two methods of kinematically positioning the improved multi-axis stage assembly within a utilization apparatus are disclosed. In another embodiment, three retroreflectors of an interferometer measuring system are mounted directly on a wafer chuck, located on the stage, and a transport system moves three interferometers rotationally, to maintain optical coupling between the interferometers and the retroreflectors. In still another embodiment, five retroreflectors are mounted directly on the wafer chuck and a five axis interferometer measuring system is utilized to eliminate all Abbe offset measurement errors in the position of a semiconductive wafer, placed upon the wafer chuck, along the X, Y, and $\theta$-axes of motion.

62 Claims, 29 Drawing Figures

CHECK AND UPDATE THE ORTHOGONALITY OF THE X AND Y AXES OF MOTION

POSITION X-Y-θ STAGE AT NOMINAL LOCATION OF ALIGNMENT MARK 176a
↓
PERFORM MARK ALIGNMENT
↓
DETERMINE δXa AND δYa
↓
POSITION X-Y-θ STAGE AT NOMINAL LOCATION OF ALIGNMENT MARK 176b
↓
PERFORM MARK ALIGNMENT
↓
DETERMINE δXb AND δYb
↓
POSITION X-Y-θ STAGE AT NOMINAL LOCATION OF ALIGNMENT MARK 176c
↓
PERFORM MARK ALIGNMENT
↓
DETERMINE δXc AND δYc

CALCULATE   $\delta\theta = (\delta Yb - \delta Ya + \delta Yb - \delta Yc) / 1$ UPDATE   $\Delta Y(new) = \Delta Y(old) - L\delta\theta$

FIG. 9

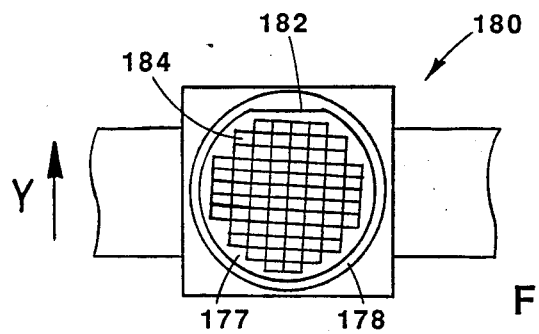

FIG. 10A

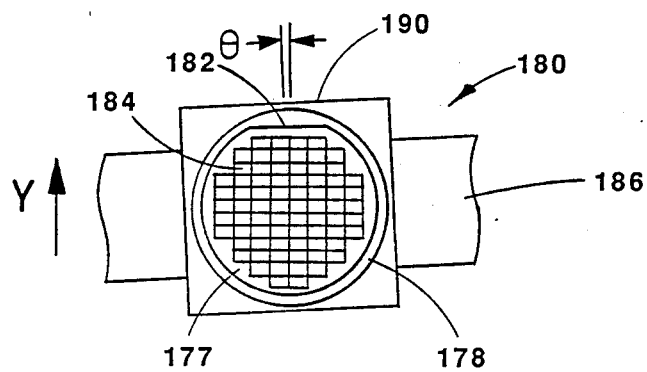

FIG. 10B

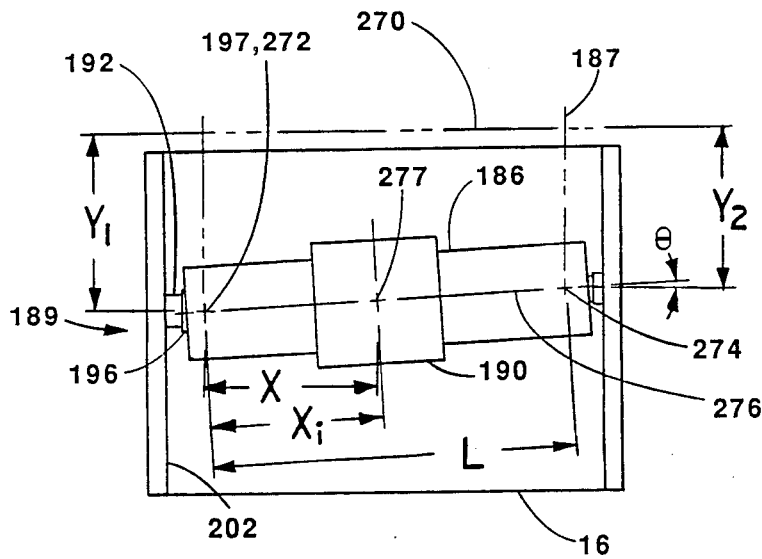

ROATATIONALLY ALIGN A SEMICONDUCTIVE WAFER

---

SET Θ = 0
↓
LOAD SEMICONDUCTIVE WAFER WITH
FLAT ORTHOGONALLY ALIGNED
↓
POSITION X-Y-Θ STAGE AT NOMINAL LOCATION OF
ALIGNMENT MARK 278a
↓
PERFORM MARK ALIGNMENT
↓
DETERMINE Xd AND Yd
↓
POSITION X-Y-Θ STAGE AT NOMINAL LOCATION OF
ALIGNMENT MARK 278b
↓
PERFORM MARK ALIGNMENT
↓
DETERMINE Xf AND Yf
↓
CALCULATE → Θ(new) = arctan(Yf-Yd) / (Xf-Xd)
↓
RESET TWO DIMENSIONAL MEASUREMENT SUB-SYSTEM
TO CALCULATED ΔY STATUS

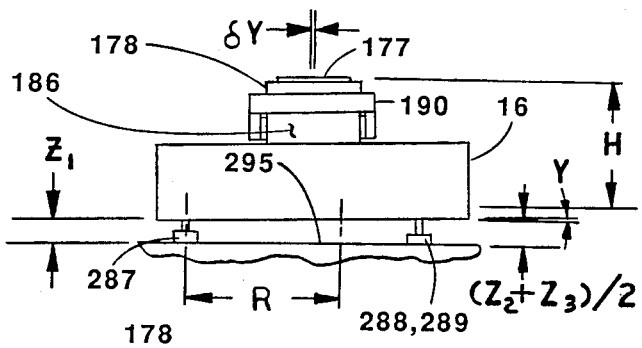
FIG. 19A
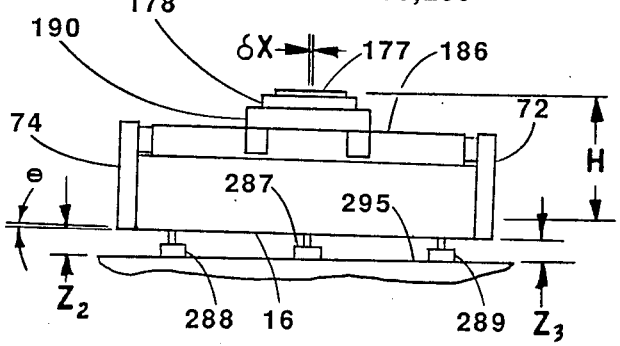
FIG. 19B
CHECK AND UPDATE
THE
Y AND X END POINT ADDRESSES
POSITION X-Y-θ STAGE AT NOMINAL
Ye AND Xe END POINT ADDRESSES
↓
FOCUS SEMICONDUCTIVE WAFER IN Z, PITCH AND ROLL
↓
DETERMINE Z1, Z2, AND Z3
↓
CALCULATE  $\alpha$ = (Z2+Z3−2Z1) / 3R
           $\beta$ = (Z2−Z3) / √3(R)
↓
CALCULATE  δY = H($\alpha$)
           δX = H($\beta$)
↓
ADD → Ye+δY
      Xe+δX
↓
POSITION X-Y-θ STAGE AT
(Ye+δY) AND (Xe+δX)
END POINT ADDRESSES
FIG. 20

4,676,649

MULTI-AXIS GAS BEARING STAGE ASSEMBLY

CROSS-REFERENCE TO RELATED APPLICATIONS

The subject matter of this application is related to that of copending U.S. patent application Ser. No. 692,011 entitled IMPROVED STEP-AND-REPEAT ALIGNMENT AND EXPOSURE SYSTEM, filed on Jan. 14, 1985, U.S. patent application Ser. No. 695,400 entitled IMPROVED STEP-AND-REPEAT ALIGNMENT AND EXPOSURE SYSTEM AND METHOD THEREFORE, filed on Jan. 28, 1985, U.S. patent application Ser. No. 759,185 entitled IMPROVED GAS BEARING, filed on July 26, 1985, and U.S. patent application Ser. No. 792,436 entitled IMPROVED GAS BEARING X-Y-$\theta$ STAGE ASSEMBLY, filed on Oct. 29, 1985, by Edward H. Phillips and they are all incorporated by reference herein.

BACKGROUND AND SUMMARY OF THE INVENTION

This invention relates generally to geometric configurations used in the construction of gas bearing X-Y-$\theta$ stage assemblies commonly utilized to facilitate the movement of an object along precisely orthogonal X and Y axes of motion and rotationally along a $\theta$-axis about a Z direction which is orthogonal to the X and Y axes. One typical use for such gas bearing X-Y-$\theta$ stage assemblies is to step and position a semiconductive wafer along X, Y and $\theta$ coordinates under the imaging lens of a step-and-repeat camera. Thus, different regions of the semiconductive wafer can be sequentially aligned and exposed in accordance with a pattern of a reticle. A typical prior art gas bearing X-Y stage assembly is shown in U.S. Pat. No. 3,722,996 entitled OPTICAL PATTERN GENERATOR OR REPEATING PROJECTOR OR THE LIKE and issued Mar. 27, 1973, to Wayne L. Fox. Disclosed in that patent is an X-Y stage which is located directly with respect to a top reference surface of a base by three stem supported bearings. It is guided along a reference edge surface of a generally L-shaped frame extending across the top reference surface of the base and orthogonal to a reference edge surface of the base by a pair of guideway bearings attached to the X-Y stage. The L-shaped frame is guided along the reference edge surface of the base by another pair of guideway bearings attached to the L-shaped frame. The orthogonality of the resulting X and Y axes of motion of the X-Y stage of that patent is determined by the accuracy of the orthogonal relationship of the reference edge surface of the L-shaped frame and the guideway bearings attached to the L-shaped frame that are used to guide the L-shaped frame along the reference edge surface of the base. Although no $\theta$-axis rotational capability is disclosed in that patent, $\theta$-axis stages are employed with such X-Y stage assemblies to construct an X-Y-$\theta$ stage assembly, which assemblies typically comprise a $\downarrow$-axis stage mounted on top of such an X-Y stage.

The gas bearing X-Y stage assembly of U.S. Pat. No. 3,722,996 has the disadvantage that the gas bearings used as guideway bearings for guiding the X-Y stage and the L-shaped frame along their corresponding reference surfaces must be of the vacuum compensated type in order to force these gas bearings into juxtaposition with their corresponding reference surfaces. Thus, if the vacuum supply pressure varies, the flying heights of the gas bearings vary concomitantly because the load on the gas bearings is proportional to the vacuum supply pressure and the flying height is a function of the load. Should the vacuum supply pressure drop to zero there would be no load at all and the elements of the gas bearing X-Y stage assembly would simply drift apart. What would be desirable is an improved multi-axis gas bearing stage assembly wherein the load impressed upon all of the guideway bearings is proportional to the gas supply pressure used to activate the guideway bearings themselves rather than a function of the vacuum supply pressure.

Another disadvantage of that gas bearing X-Y stage assembly is its inefficient use of space. As illustrated in U.S. Pat. No. 3,722,996, the size of the envelope encompassing the X-Y stage and its extent of travel along the X and Y axes of motion is only a fraction of the total lateral area of the gas bearing X-Y stage assembly. What would be desirable is an improved multi-axis gas bearing stage assembly wherein the size of the envelope encompassing an X-Y-$\theta$ stage and its extent of travel along the X, Y and $\theta$ axes of motion is substantially the same as the total lateral area of the multi-axis gas bearing stage assembly.

Another disadvantage of the gas bearing X-Y stage assembly of U.S. Pat. No. 3,722,996 and virtually all other gas bearing X-Y stage assemblies is that the orthogonality of its X and Y axes of motion is solely determined by the mechanical orthogonality of a reference surface (the reference edge surface of the L-shaped frame) and guideway bearings (the two guideway bearings attached to the L-shaped frame used for guiding the L-shaped member along the reference edge surface of the base) of an intermediate stage element (the L-shaped frame). What would be desirable is an improved multi-axis gas bearing stage assembly wherein the orthogonality of its X and Y axes of motion is controlled with reference to a three dimensional measurement system, whose frame of reference is the base of the multi-axis gas bearing stage assembly, and which may in turn be correlated with a measurement standard of orthogonality whenever desired. If the measurment standard of orthogonality were also a component sub-assembly of the multi-axis gas bearing stage assembly then control of the orthogonality of its X and Y axes of motion could be accomplished as a software function.

Further, it would be desirable to have an improved multi-axis gas bearing stage assembly wherein the motion control of the Y-axis is bifurcated by having parallel but separated Y and Y motion controls that are independently controllable for rotating the X-Y-$\theta$ stage in a preselected manner. Thus, a semiconductive wafer positioned on a wafer chuck mounted upon the X-Y-$\theta$ stage could be oriented rotationally with respect to the base of a step-and-repeat camera without employing a $\theta$-axis stage between the X-Y stage and the wafer chuck.

Still another disadvantage of some gas bearing X-Y-$\theta$ stage assemblies utilized for semiconductive wafers is that while they must rotate the semiconductive wafer in pitch and roll during wafer processing, their metrology systems do not directly measure the position of the semiconductive wafer. Rather, their metrology systems measure the position of an X-Y-$\theta$ stage that either supports, or is supported by, a leveling mechanism and those measurements are made in an offset manner. The resulting position of the semiconductive wafer is then subject to an error equal to the product of an effective offsetting distance and the pitch or roll angle. This type of measurement error is called Abbe offset error (after the German optical physicist Ernst Abbe). An example of an X-Y-$\theta$ stage assembly subject to such an Abbe offset error is shown in U.S. Pat. No. 4,391,494 entitled APPARATUS FOR PROJECTING A SERIES OF IMAGES ONTO DIES OF A SEMICONDUCTOR WAFER and issued July 5, 1983 to Ronald S. Hershel.

Accordingly, it is a principal object of this invention to provide an improved multi-axis gas bearing stage assembly wherein the size of the lateral envelope encompassing an X-Y-$\theta$ stage and its extent of travel along the X and Y axes of motion is substantially the same as the total lateral area of the improved multi-axis gas bearing stage assembly.

Another object of this invention is to provide an improved multi-axis gas bearing stage assembly wherein the orthogonality of its X and Y axes of motion is controlled with reference to a three dimensional measurement system whose frame of reference is the base of the improved multi-axis gas bearing stage assembly.

Another object of this invention is to provide a three dimensional measurement system for use as a reference for the control of the orthogonality of the X and Y axes of motion of the improved multi-axis gas bearing stage assembly.

Another object of this invention is to provide a measurement standard of orthogonality, which is a component sub-assembly of the improved multi-axis gas bearing stage assembly, for use in correlating the three dimensional measurement system.

Another object of this invention is to provide a method of correlating the three dimensional measurement system with the measurement standard of orthogonality.

Another object of this invention is to provide an improved multi-axis gas bearing stage assembly wherein the motion control of the Y-axis is bifurcated by having parallel but separated $Y_1$ and $Y_2$ motion controls that are independently controllable, for use in rotatably positioning the X-Y-$\theta$ stage of the improved multi-axis stage assembly along a $\theta$-axis of motion.

Another object of this invention is to provide a method of controlling the rotational positioning of the X-Y-$\theta$ stage of the improved multi-axis gas bearing stage assembly along the $\theta$-axis of motion.

Another object of this invention is to provide an improved multi-axis stage assembly wherein a semiconductive wafer loading plane of the improved multi-axis stage assembly is fixedly located relative to a utilization apparatus in the directions of the X, Y and $\theta$ axes of motion of the X-Y-$\theta$ stage, for eliminating Abbe offset measurement errors to the plane of the semiconductive wafer.

Another object of this invention is to provide an improved multi-axis stage assembly wherein the motions of a chuck mounting spider (and therefore, of a wafer chuck of the X-Y-$\theta$ stage of the improved multi-axis stage assembly) are directly controlled by a three axis interferometer system along the X, Y and $\theta$ axes of motion, for minimizing various measurement errors, including other Abbe offset measurement errors to the position of the semiconductive wafer.

Another object of this invention is to provide an improved multi-axis stage assembly wherein the motions of the chuck mounting spider are directly controlled by a five axis interferometer system along the X, Y and $\theta$ axes of motion, for eliminating still other Abbe offset measurement errors, to the position of the semiconductive wafer, in the pitch and roll directions.

Still another object of this invention is to provide an improved multi-axis gas bearing stage assembly wherein the X-Y-$\theta$ stage is located by guideway bearings whose loading is proportional to the gas supply pressure used to activate the guideway bearings themselves.

These and other objects, which will become apparent from an inspection of the accompanying drawings and a reading of the associated description, are accomplished according to illustrated preferred embodiments of the present invention by providing improved multi-axis gas bearing stage assemblies with an intermediate stage element that is guided along a reference edge surface of a base by a single guideway bearing, and controlled with reference to a two dimensional measurement sub-system, of a three dimensional measurement system, whose frame of reference is the base of the multi-axis gas bearing stage assembly. An X-Y-$\theta$ stage is located with respect to the intermediate stage element by a plurality of gas bearings. It is guided along a reference edge surface of the intermediate stage element by a pair of guideway bearings, and controlled with reference to a third dimension measurement sub-system of the three dimensional measurement system, whose frame of reference is the intermediate stage element. All three of the guideway bearings are forced into juxtaposition with their corresponding reference surfaces by opposing axially loaded guideway bearing assemblies which are loaded in a hysteresis free manner by the gas supply pressure.

The improved multi-axis gas bearing stage assemblies also include a measurement standard of orthogonality comprising a two dimensional pattern of indicia mounted upon the X-Y-$\theta$ stage and an optical sub-system located with respect to the base sub-assembly for viewing the indicia. The two dimensional pattern of indicia is sequentially aligned with respect to the optical sub-system and a corresponding software correction is made to the two dimensional measurement sub-system used as a reference for the control of the intermediate stage element.

Differential motion control of the intermediate stage element, with reference to its two dimensional measurement sub-system, is utilized to provide rotational positioning of the X-Y-$\theta$ stage along a $\theta$-axis of motion about a direction orthogonal to the X and Y axes of motion. The method of controlling the rotational positioning of the intermediate stage element and the X-Y position of the X-Y-$\theta$ stage comprises utilizing the separation of the two portions of the two dimensional measuring sub-system and a tangent function of the preselected rotational angle to calculate the $\Delta Y$ length difference of the two portions of the two dimensional measuring sub-system; calculating the X-axis position by utilizing a cosine function of the rotational angle $\theta$; and calculating the Y-axis position by utilizing a first portion of the two dimensional measurement sub-system and a sine function of the rotational angle $\theta$.

Alternative preferred embodiments of the present invention utilize different methods of eliminating various manifestations of Abbe offset errors. In one preferred embodiment, the base of the multi-axis gas bearing stage assembly is located with respect to an optical imaging system of a step-and-repeat camera by a kinematic positioning apparatus wherein three kinematic constraints are coplaner with the semiconductive wafer being processed. In another preferred embodiment, the X-Y position of the semiconductive wafer plane is controlled by software computation. In another preferred embodiment, a three axis interferometer measuring system controls the position of a chuck mounting spider (which supports a wafer chuck of the X-Y-$\theta$ stage) directly. The chuck mounting spider's position is measured in a plane parallel to and nearly coplanar with a semiconductive wafer being processed, and the semiconductive wafer's actual position is determined by computer calculation. In still another preferred embodiment, a five axis interferometer measuring system is used to provide five axis control of the position of the chuck mounting spider. Thus, remaining minute pitch and roll derived Abbe offset measurement errors (of the position of the semiconductive wafer being processed) are eliminated.

BRIEF DESCRIPTION OF THE DRAWINGS

FIG. 9 is a flow chart outlining the procedure followed in checking and updating the orthogonality of the X and Y axes of motion of the improved multi-axis gas bearing stage assembly.

FIG. 10A is a plan view of any of the improved multi-axis gas bearing stage assemblies, with a wafer chuck and a semiconductive wafer having previously printed and processed layers of microcircuitry mounted thereon.

FIG. 10B is a plan view of the improved multi-axis gas bearing stage assembly of FIG. 10A wherein differential control of the intermediate stage element of the improved multi-axis gas bearing stage assembly is utilized to rotationally align rows and columns of microcircuitry (on the semiconductive wafer) with respect to the X and Y axes of motion of the X-Y-$\theta$ stage.

FIG. 15 is a graphic drawing illustrating the differential control of the intermediate stage element.

FIG. 16 is a flow chart outlining the procedure followed in controlling the rotational positioning of the X-Y-$\theta$ stage.

FIGS. 19A and 19B are graphic drawings illustrating parameters of the software computation of the location of the improved multi-axis gas bearing stage assembly of FIG. 18.

FIG. 20 is a flow chart outlining the procedure followed in positioning the X-Y-$\theta$ stage of the improved multi-axis gas bearing stage assembly of FIG. 18.

DESCRIPTION OF THE PREFERRED EMBODIMENTS

Figure 1:
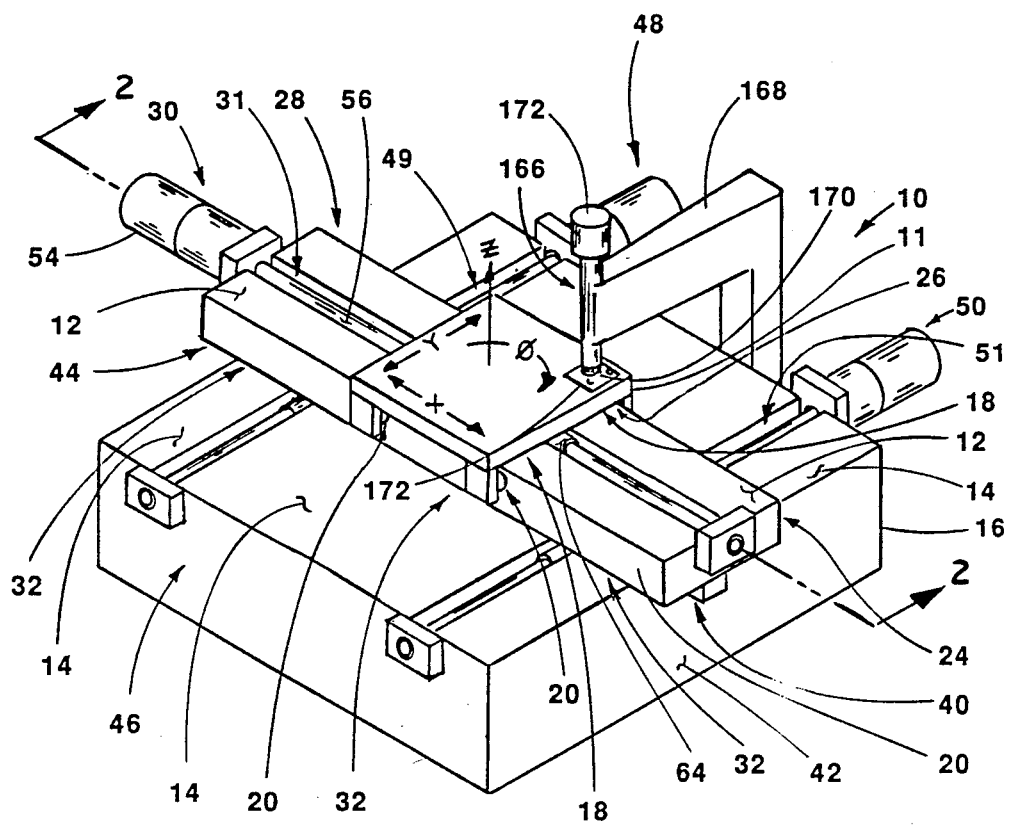
FIG. 1 is an isometric view of an improved multi-axis gas bearing stage assembly in accordance with a preferred embodiment of the present invention wherein the moving elements of the assembly are leadscrew driven.

Shown in FIGS. 1, 2, 3 and 4, is an improved multi-axis gas bearing stage assembly 10, according to a preferred embodiment of the present invention. An X-Y-$\theta$ stage 11 is constrained for movement along orthogonal X and Y axes and along a $\theta$-axis about a Z direction orthogonal to both the X and Y axes of motion. The X-Y-$\theta$ stage 11 can move to any position in a plane which is parallel to a top reference surface 12 of an intermediate stage element 24 and a top reference surface 14 of a base 16.

A plurality of vacuum stabilized gas bearings 18 (shown in detail in FIG. 3) locate and stabilize the X-Y-$\theta$ stage 11 with respect to the top reference surface 12 of the intermediate stage element 24, and two stem-supported, guideway gas bearings 20 locate the X-Y-$\theta$ stage with respect to an edge reference surface 22 of the intermediate stage element 24. The guideway gas bearings 20 are forced into juxtaposition with the edge reference surface 22 of the intermediate stage element 24 by opposing axially loaded guideway gas bearing assemblies 26 (such as those described in copending and incorporated U.S. patent application Ser. No. 759,185) which bear against an opposite edge surface 28 of the intermediate stage element 24. The X-Y-$\theta$ stage 11 is driven to selected locations along the X-axis of motion with respect to the intermediate stage element 24 by an X-axis drive assembly 30. The X-axis drive assembly 30 is located in a slot 31 formed in the center of the top surface of the intermediate stage element 24. This location positions the X-axis drive assembly under the center of gravity of the X-Y-$\theta$ stage 11 and minimizes dynamic loading of the guideway gas bearings 22.

The intermediate stage element 24 is constrained for movement along the Y-axis of motion to any position in a second horizontal plane which is parallel to the top reference surface 14 of the base 16 and located between the X-Y-$\theta$ stage 11 and the top reference surface 14. A plurality of vacuum stabilized gas bearings 32 (shown in detail in FIG. 4) locate and stabilize the intermediate stage element 24 with respect to the top reference surface 14 of the base 16. Each vacuum stabilized gas bearing 18 or 32 comprises a vacuum pocket 34, two single slotted gas bearing pockets 36 and two input flow restrictors 38 as fully described in copending and incorporated U.S. patent application Ser. No. 759,185. A single, stem-supported, guideway gas bearing 40 locates the intermediate stage element 24 with respect to an edge reference surface 42 of the base 16. The guideway gas bearing 40 is forced into juxtaposition with the edge reference surface 42 by an opposing axially loaded guideway gas bearing assembly 44 which bears against an opposite edge surface 46 of the base 16. The intermediate stage element 24 is driven to selected locations along the Y-axis of motion with respect to the base 16 and constrained orthogonally with respect to the edge reference surface 42 of the base 16 by first and second Y-axis drive assemblies 48 and 50, respectively. The first and second Y-axis drive assemblies are located in slots 49 and 51, respectively, which are formed in the top surface of the base 16. The first and second Y-axis drive assemblies are located symmetrically with respect to the intermediate stage element 24 at a separation distance of substantially two-thirds of the length of the intermediate stage element. This location positions the first and second Y-axis drive assemblies 48 and 50 under the centers of percussion of the intermediate stage element 24 and minimizes the dynamic loadings present in the intermediate stage element.

Figure 2:
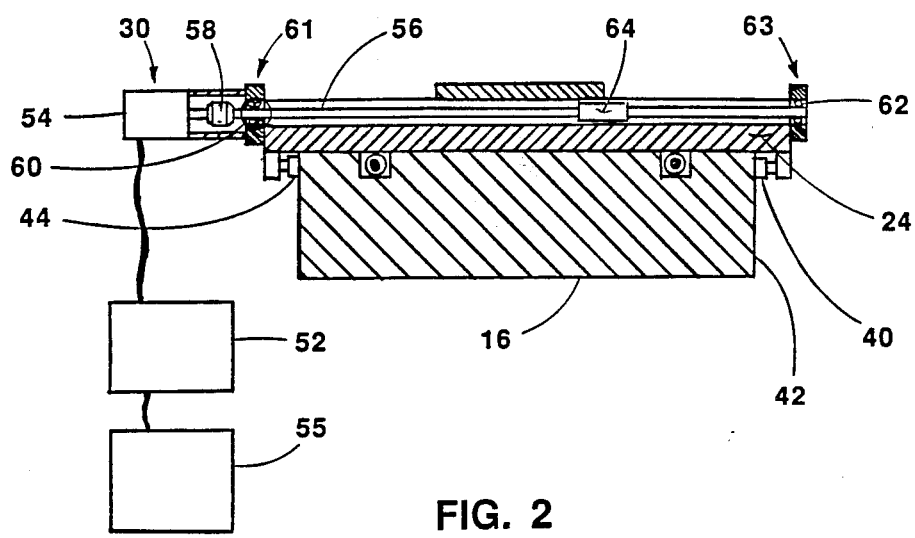
FIG. 2 is a sectional view of the improved multi-axis gas bearing stage assembly of FIG. 1.
Figure 3:
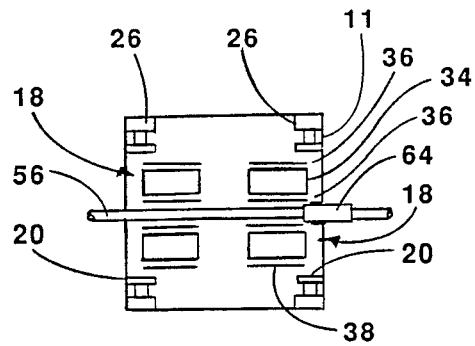
FIG. 3 is a plan view of the under-side of an X-Y-$\theta$ stage of the improved multi-axis gas bearing stage assembly of FIG. 1.
Figure 4:
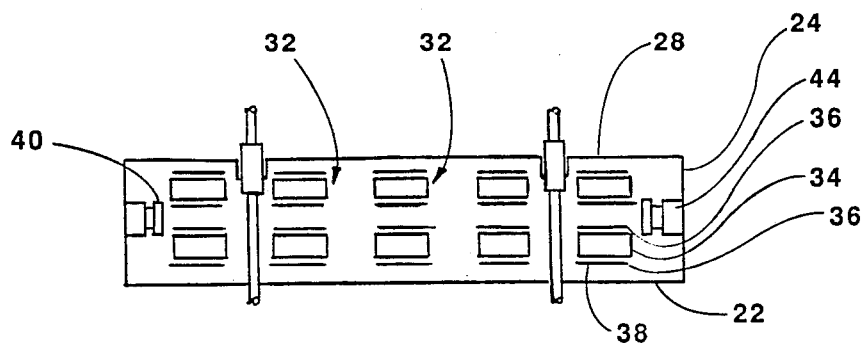
FIG. 4 is a plan view of the under-side of an intermediate stage element of the improved multi-axis gas bearing stage assembly of FIG. 1.

Each one of the drive assemblies 30, 48 and 50 comprises a grouping of components substantially the same as that shown in detail in FIG. 2, for X-axis drive assembly 30. An electronic controller 52 drives a motor-encoder 54 in a manner determined by a computer 55. The motor-encoder 54 drives a lead screw 56 via a shaft coupling 58. The lead screw 56 is located with respect to the intermediate stage element 24 by a double row ball bearing sub-assembly 60 and a single row ball bearing 62. The bearing sub-assembly 60 locates the lead screw 56 with respect to the intermediate stage assembly 24 by providing a five degree of freedom constraint to the motor-encoder end 61 of the lead screw 56, including axial location. The single row ball bearing 62 provides a two degree of freedom constraint to the outboard end 63 of the lead screw 56. The additional two degree of freedom constraint is provided to improve the dynamic rotational stability of the lead screw 56. (This method of increasing the rotational stability of shafts such as the lead screw 56 is described in a section entitled "Formulas for Critical Speeds" contained in Machinery's Handbook, published by Industrial Press Inc. of New York, N.Y.) The lead screw 56 drives the X-Y-$\theta$ stage 11 via a nut 64. One example of a suitable lead screw-nut combination for this purpose is a self-adjusting, self aligning lead screw and nut assembly available from the Universal Thread Grinding Company of Fairfield, Conn. The motor-encoder 54 can comprise any motor driven device that has a controllable angular position capability. A line of 1.8 degree step motors manufactured by The Superior Electric Company of Bristol, Conn. comprises one example of such a motor-encoder.

Figure 5:
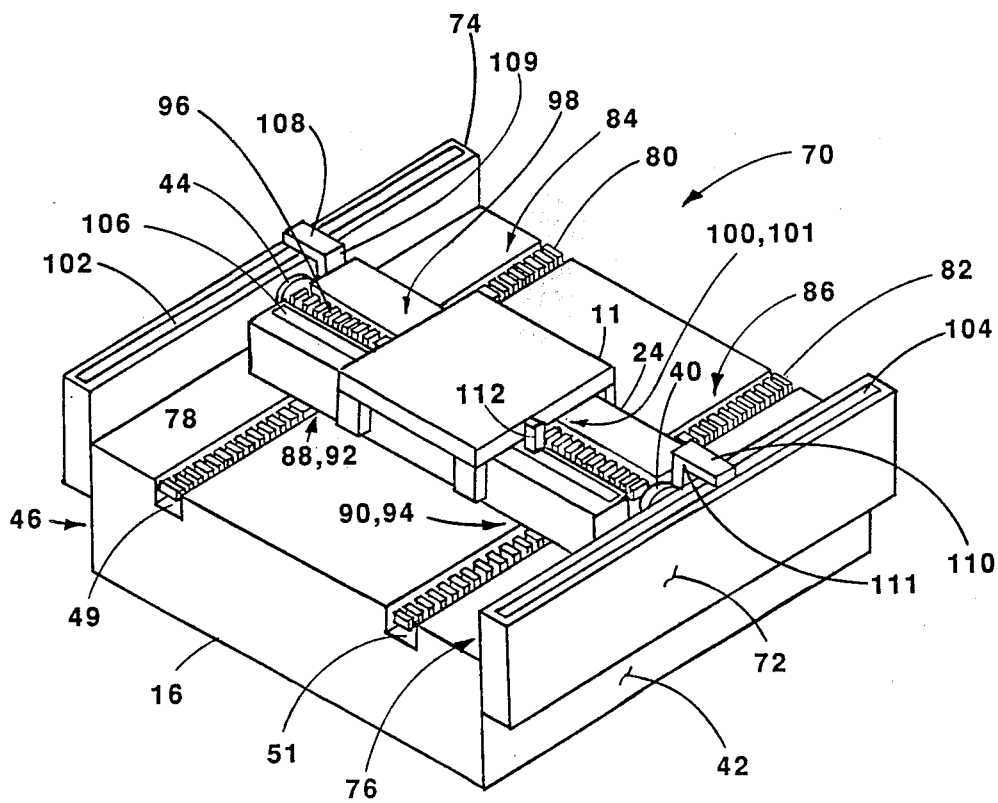
FIG. 5 is an isometric view of another improved multi-axis gas bearing stage assembly in accordance with an alternative embodiment of the present invention wherein the moving elements of the assembly are linear motor driven and their position is measured by position feedback scales.

Shown in FIG. 5, is an improved multi-axis gas bearing stage assembly 70, according to an alternative preferred embodiment of the present invention wherein the motor-encoders are replaced by linear motors and measuring scales. First and second side plates 72 and 74 are mounted on the edge reference surface 42 and the opposite edge surface 46, respectively, of the base 16. The guideway gas bearing 40 is now forced into juxtaposition with an inside reference surface 76 of the side plate 72 by the axially loaded guideway gas bearing assembly 44 which bears against an opposite inside surface 78 of the side plate 74. First and second static portions 80 and 82 of first and second Y-axis linear motors 84 and 86 are mounted in the slots 49 and 51, respectively. First and second moving portions 88 and 90 of the first and second Y-axis linear motors 84 and 86 are mounted in first and second cavities 92 and 94, respectively, formed in the bottom surface of the intermediate stage element 24 (not shown). A static portion 96 of an X-axis linear motor 98 is mounted in the slot 31 and a moving portion 100 of the X-axis linear motor 98 is mounted in a cavity 101 formed in the bottom surface of the X-Y-$\theta$ stage 11 (not shown). One example of such linear motor assemblies is a linear dc motor comprising a moving magnet sub-assembly and a static linear coil assembly known as the Anoline linear motor and manufactured by Anorad Corp. of Hauppauge, N.Y.

First and second Y-axis measuring scales 102 and 104 are mounted on the tops of the side plates 72 and 74, respectively. An X-axis measuring scale 106 is mounted on the top of the intermediate stage element 24 in close proximity to the static portion 96 of X-axis linear motor 98. First and second Y-axis read heads 108 and 110 are correspondingly mounted on brackets 109 and 111, respectively, which are affixed to the ends of the intermediate stage element 24. The X-axis read head 112 is mounted on the X-Y-θ stage 11. One example of such linear measuring scales and read heads is manufactured by the Magnescale Division of Sony Corp. of Tokyo, Japan. A servo controller (not shown) is utilized to control each of the three axes so that their linear measuring scale outputs match values determined by the computer 55.

An example of a linear drive system that combines the functions of the linear motor assemblies and the measuring scales is a line of linear step motors manufactured by Xynetics, A Unit of General Signal, of Santa Clara, Calif. Since these linear step motors comprise both a linear drive and an accurate positioning capability, the requirement for additional measuring scales would be obviated with their use.

Figure 6:
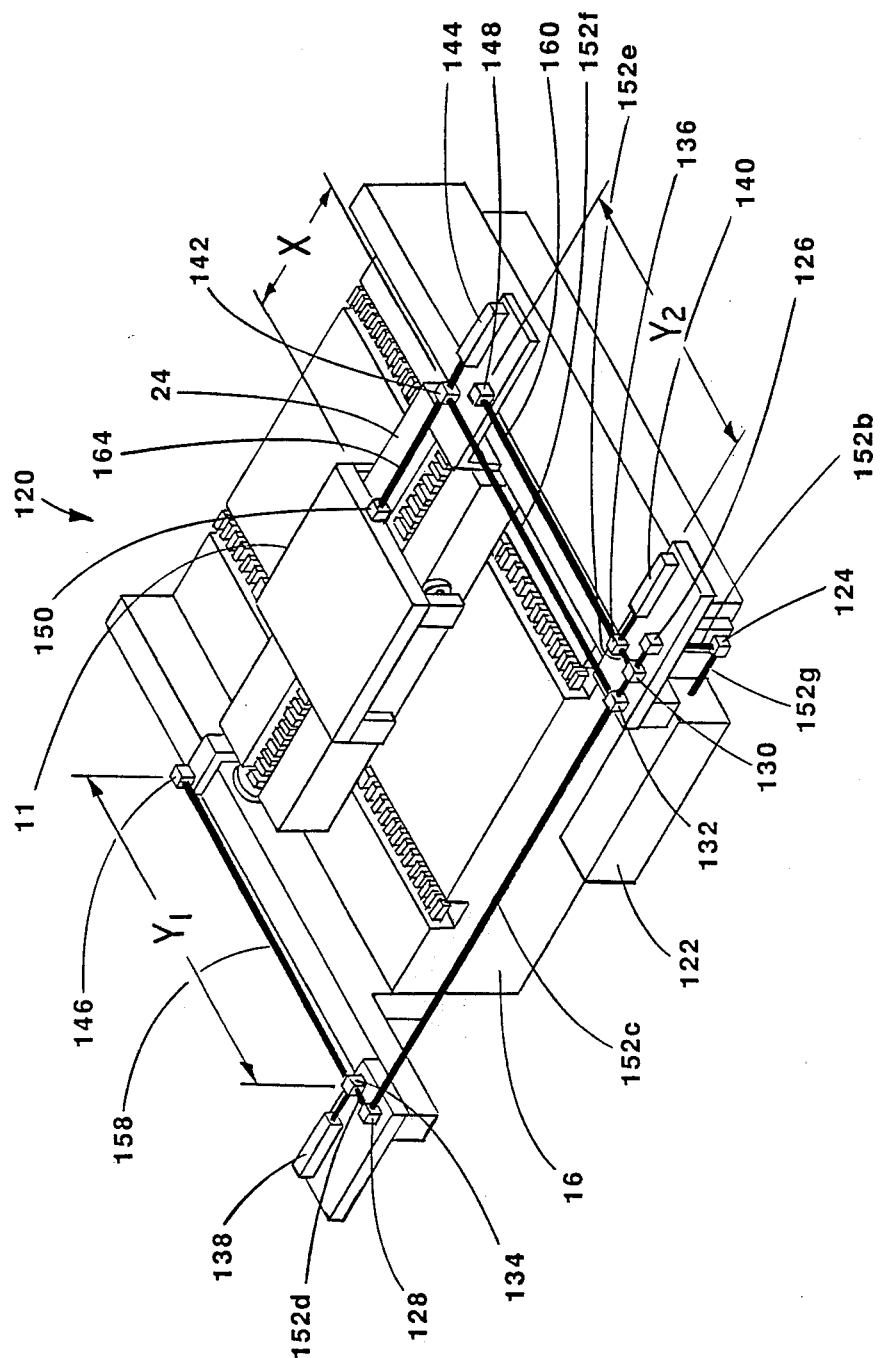
FIG. 6 is an isometric view of another improved multi-axis gas bearing stage assembly in accordance with another alternative embodiment of the present invention wherein the moving elements of the assembly are linear motor driven and their position is measured by laser interferometry.

Shown in FIG. 6, is an improved multi-axis gas bearing stage assembly 120, according to another alternative preferred embodiment of the present invention wherein the measuring scales are replaced by laser interferometers. A laser source 122, beam benders 124, 126 and 128, a 33% beam splitter 130, a 50% beam splitter 132, interferometers 134 and 136, and receivers 138 and 140 are mounted on the base 16. An interferometer 142, a receiver 144, and retroreflectors 146 and 148 are mounted on the intermediate stage element 24. A retroreflector 150 is mounted on the X-Y-θ stage 11.

A retroreflector is defined as an optical element that reflects light in such a manner that incident and reflected light beams are parallel to one another. For instance, a plane mirror can serve as a retroreflector when an incident light beam is orthogonal to the reflective surface of the plane mirror; a roof mirror can serve as a retroreflector when an incident light beam is orthogonal to the apex of the roof mirror; and a corner mirror will always serve as a retroreflector whenever an incident light beam falls within the corner mirror's acceptance aperture. Since the X-Y-θ stage 11 and the intermediate stage element 24 are subject only to orthogonal motions in the X and Y directions, the retroreflectors 146, 148 and 150 can be mounted orthogonally with respect to their respective incident light beams. Thus, plane, roof, or corner mirrors may be used for the retroreflectors 146, 148 and 150 in the improved multi-axis gas bearing stage assembly 120.

Operationally, a laser beam emanates from the laser source 122 and is transmitted in equal intensities to each of interferometers 134, 136 and 142 via the beam benders 124, 126 and 128, and beam splitters 130 and 132, along laser beam paths 152a, 152b, 152c, 152d, 152e and 152f. Each of the interferometers splits its incoming laser beam into reference and measurement beams. The reference beam is routed to the corresponding receiver directly while the measurement beam traverses the distance to and from the corresponding retroreflector before being routed to the same receiver. Thus, first and second Y-axis measurement distances $Y_1$ and $Y_2$ comprise measurement beam paths 158 and 160, respectively, and X-axis measurement distance X comprises measurement beam path 164. Suitable laser interferometer apparatus for implementing the above is manufactured by the Hewlett-Packard Co. of Palo Alto, Calif. Detailed application and operational information is shown in a system operating and service manual entitled Laser Transducer System 5501A which is available from the Hewlett-Packard Co., and it is incorporated by reference herein.

Although the improved multi-axis gas bearing stage assembly 120 has been shown with linear drive motors, it could be driven with other drive assemblies, similar to the drive assemblies 30, 48 and 50 of the improved multi-axis gas bearing stage assembly 10. Such drive assemblies would normally have a motor-tachometer instead of the motor-encoder 54. Also, such drive assemblies (including the motor-tachometer instead of the motor-encoder) could be used with the measuring scales 102, 104 and 106 of the improved multi-axis gas bearing stage assembly 70.

Figure 7:
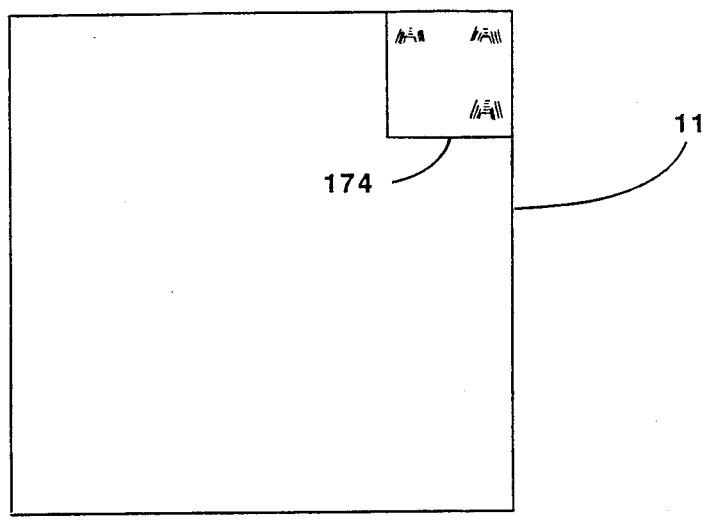
FIG. 7 is a plan view of he X-Y-$\theta$ stage of any of the improved multi-axis gas bearing stage assemblies with a measurement standard of orthogonality mounted thereon.
Figure 8:
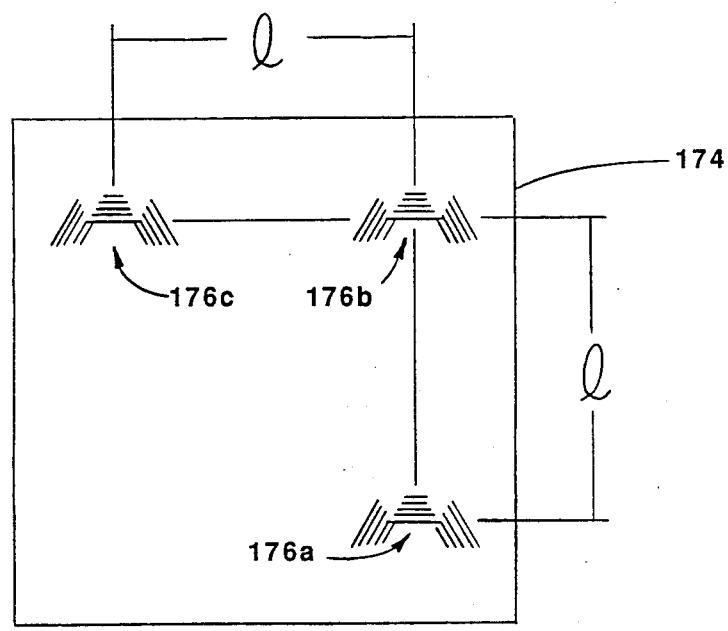
FIG. 8 is an enlarged view of the measurement standard of orthogonality.

In FIG. 1, there is shown an optical alignment sub-assembly 166 which is mounted on the base 16 via a mounting arm 168. The optical alignment sub-assembly 166 includes a microscope lens 170 and an electro-optical transducer 172 which is connected to the electronic controller 52. The optical alignment sub-assembly 166 is adapted for observing a measurement standard of orthogonality 174 which is mounted on the X-Y-θ stage 11 as shown more clearly in FIG. 7. FIG. 8 shows an enlarged plan view of the measurement standard of orthogonality 174 which comprises three alignment marks 176a, 176b and 176c. The alignment marks 176a, 176b and 176c are spaced away from one another by a distance 1 and are arranged in a orthogonal L-shaped array. The L-shaped array has one side oriented orthogonally with respect to the intermediate stage element 24.

The flow chart of FIG. 9 outlines the procedure followed to check and update the orthogonality of the X and Y axes of motion. According to the procedure outlined, the X-Y-θ stage 11 is sequentially positioned at the nominal locations where the images of the three alignment marks 176a, 176b and 176c should be in alignment with the electro-optical transducer 172 and actual alignments are made at each location. Alignment errors are determined for each location and an orthogonality error angle $\delta\theta$ is calculated by the computer 55 through use of the formula $$\delta\theta = (\delta Y_b - \delta Y_a + \delta X_b - \delta X_c)/1,$$

where $\delta Y_a$ and $\delta Y_b$ are the Y-axis alignment errors of alignment marks 176a and 176b, respectively, and $\delta X_b$ and $\delta X_c$ are the X-axis alignment errors of alignment marks 176b and 176c, respectively. Finally, the procedure is completed by updating the differential value of the controlled positions of a two dimensional measurement sub-system 188, of a three dimensional measurement system 189 utilized for controlling all three drive axes, to reduce the orthogonality error angle to zero. In the multi-axis gas bearing stage assembly 10, these positions along the drive axes are controlled by the first and second Y-axis drive assemblies 48 and 50, respectively, and in the multi-axis gas bearing stage assemblies 70 and 120, these positions along the drive axes are determined by the equivalent measuring scales or laser interferometer components. The new differential value $\delta Y(\text{new}) = Y_1 - Y_2$ is calculated by the computer 55 through use of the formula $$\delta Y(\text{new}) = Y(\text{old}) - L\delta\theta,$$

where $Y_1$ and $Y_2$ are the values of the controlled positions of first and second portions 185 and 187, respectively, of the two dimensional measurement sub-system 188, δY(old) is the value of $Y_1-Y_2$ used in the sequential positioning during the alignments and L is the physical distance separating the first and second portions of the two dimensional measurement sub-system.

Any automatic alignment mark and electro-optical transducer system of acceptable accuracy may be used for alignment marks 176a, 176b and 176c, and electro-optical transducer 172, respectively. One such system is thoroughly described in copending and incorporated U.S. patent application Ser. No. 695,400. A detailed description of its operation is presented therein, with particular reference to FIGS. 5A, 5B, 6, 7A, 7B, 7C, 7D and 11. Also, the function of the optical alignment subassembly 166 may be undertaken by the optical apparatus fully described in U.S. patent application Ser. No. 695,400, with particular reference to FIGS. 1, 3A, 3B and 3C.

In FIG. 10A, there is shown a semiconductive wafer 177 mounted on a wafer chuck 178 positioned on top of an improved multi-axis gas bearing stage assembly 180, which may comprise any of the afore-mentioned improved multi-axis gas bearing stage assemblies, 10, 70 or 120. The semiconductive wafer 177 has an alignment flat 182 which is oriented with respect to the crystal structure of the silicon from which the semiconductive wafer 177 was made. The semiconductive wafer 177 also has rows and columns of previously printed and processed lower levels of microcircuitry 184, with each succeeding level aligned with a first level of microcircuitry contained therein. The semiconductive wafer 177 is mounted with its alignment flat 182 orthogonal to the Y-axis of motion as shown but, because of realistic tolerances involved in the placement of the first level of microcircuitry, the rows and columns of previously printed and processed lower levels of microcircuitry 184 are not necessarily in similar alignment. Thus, provision for rotational alignment of the semiconductive wafer 177 must be provided as a feature of the improved multi-axis gas bearing stage assembly 180. Typically, plus or minus 3 degrees of rotation is provided.

Many prior art gas bearing X-Y-θ stage assemblies have additionally included a rotational stage between their X-Y stage and wafer chuck to provide this feature and allow for the global alignment of the semiconductive wafer 177. A typical example of such a rotational stage is shown in U.S. Pat. No. 4,345,836 entitled TWO-STAGE WAFER PREALIGNMENT SYSTEM FOR AN OPTICAL ALIGNMENT AND EXPOSURE MACHINE and issued Aug. 24, 1982, to Edward H. Phillips. The prior art rotational stages have been marginally acceptable in practice. They are costly and bulky. Further, they have only marginal truth of rotation and contribute locational errors to the semiconductive wafer's position along the X and Y axes of motion.

As shown in FIG. 10B, rotational orientation of an X-Y-θ stage 190 of the improved multi-axis stage assembly 180 can be provided by differential motion control of an intermediate stage element 186, with reference to the two dimensional Y-axis measurement sub-system 188. Thus, the intermediate rotational stage, typical of prior art X-Y-θ stage assemblies, and all its associated problems can be eliminated entirely.

Differential motion control of the intermediate stage element 186 requires non-orthogonal operation of the intermediate stage element. Particularly, this requirement means that a swivelable guideway gas bearing should be used in place of the stem-supported, guide-way gas bearing 40. Further, it affects the mounting of the driven lead screw nuts of the drive assemblies 48 and 50 of the improved multi-axis gas bearing stage assembly 10 and the routing of the laser beam through the X-axis interferometer 142 of the improved multi-axis gas bearing stage assembly 120.

Figure 11:
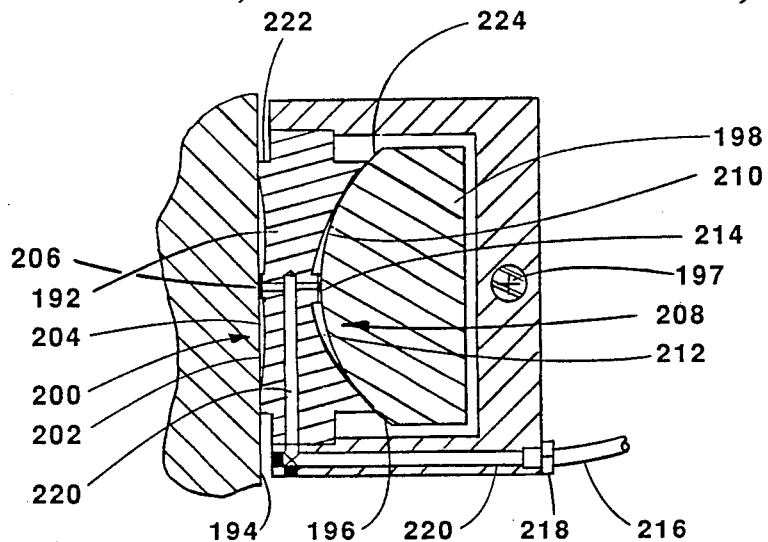
FIG. 11 is a section view of a plano-concave guideway gas bearing used to enable differential control of the intermediate stage assembly.
Figure 12A:
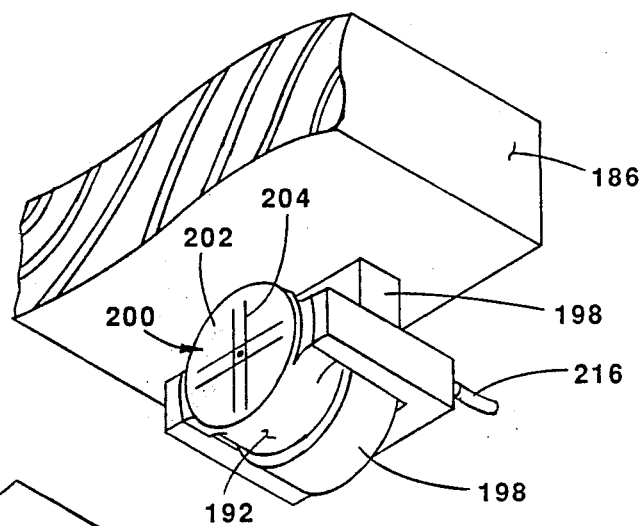
FIGS. 12A and 12B are isometric views showing the plano-concave gas bearing and its mounting block mounted on an end of the intermediate stage element for the improved multi-axis gas bearing stage assemblies of FIGS. 1 and 5 and 6, respectively.
Figure 12B:
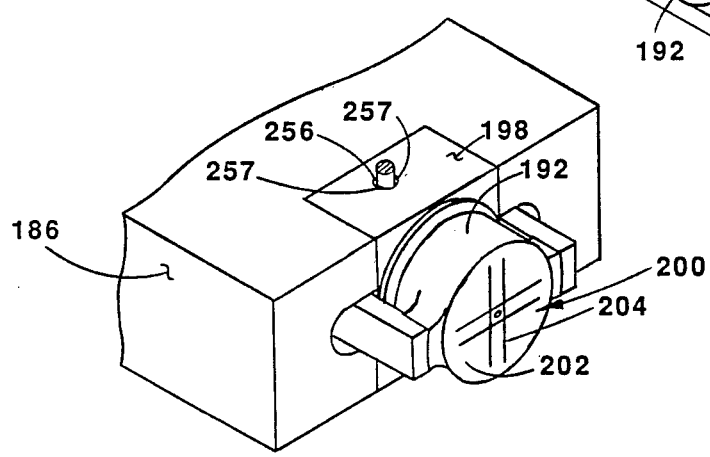

In FIG. 11, there is shown a plano-concave, swivelable guideway gas bearing 192 positioned between a flat reference surface 194, which may comprise either the edge reference surface 42 of the base 16 or the inside reference surface 76 of the side plate 72, and a convex reference surface 196 of a mounting block 198. The plano-concave, swivelable gas bearing 192 has a plano gas bearing 200 comprising a bearing surface 202, a bearing pocket 204 and a flow restrictor 206, and a concave gas bearing 208 comprising a concave bearing surface 210, a bearing pocket 212 and a flow restrictor 214. The center 197 of the convex reference surface 196 is concomitantly the center of relative rotation between the plano-concave, swivelable gas bearing 192 and the intermediate stage element 186. The fabrication details and performance characteristics of gas bearings such as the plano and concave gas bearings 200 and 208, respectively, are discussed in detail in copending and incorporated U.S. patent application Ser. No. 759,185, especially with reference to FIG. 4 of that patent application. Pressurized gas enters the plano-concave, swivelable gas bearing 192 via a hose 216, a fitting 218 and passages 220 and flows through the flow restrictors 206 and 214, bearing pockets 204 and 212, and operating clearances 222 and 224, respectively. Operationally, the gas pressure within the bearing pockets 204 and 212 and the operating clearances 222 and 224 supports the plano gas bearing 200 and the concave gas bearing 208 portions of the plano-concave, swivelable gas bearing 192, respectively, in a stable, friction free manner. The mounting block 198 is mounted on the end of the intermediate stage element 186 nearest the first portion 185 of the two dimensional Y-axis measurement system 188, as shown in FIG. 12A for the improved multi-axis gas bearing stage assembly 10, or FIG. 12B for the improved multi-axis gas bearing stage assemblies 70 and 120.

Figure 13:
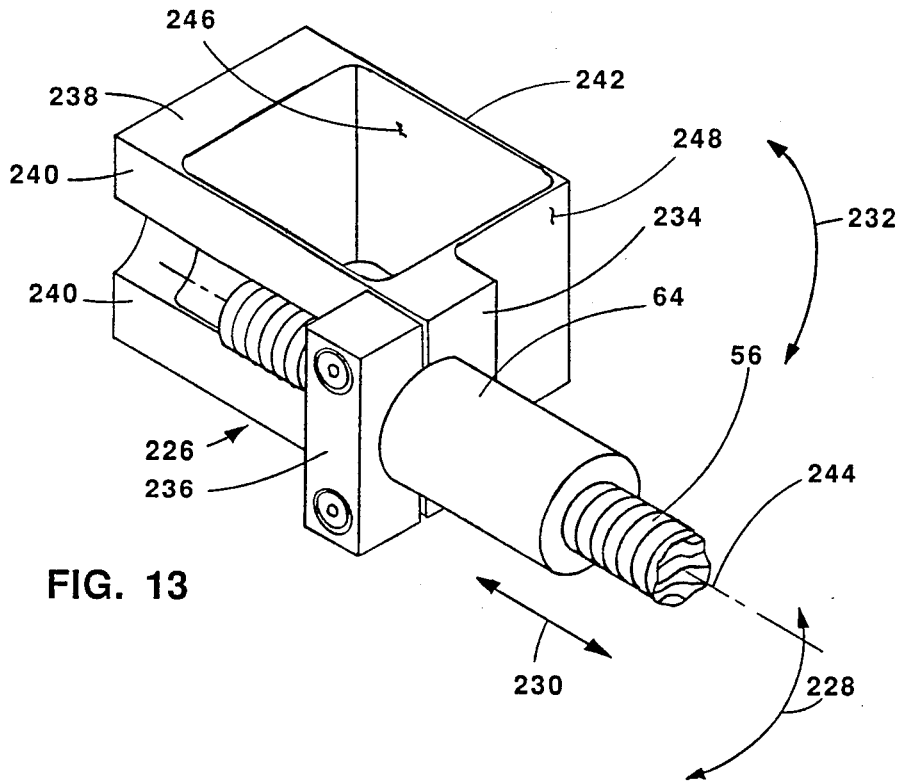
FIG. 13 is an isometric view of a flexible lead screw nut mount used to enable differential control of the intermediate stage element of the improved multi-axis gas bearing stage assembly of FIG. 1.

In FIG. 13, there is shown a flexible lead screw nut mount 226 useful for mounting the driven lead screw nuts 64 of both the drive assemblies 48 and 50 of the improved multi-axis gas bearing stage assembly 10 when it is utilized as the improved multi-axis gas bearing stage assembly 180 of FIG. 10B. The flexible lead screw nut mount 226 must be compliant in the yaw direction 228 and rigid in the thrust and roll directions 230 and 232, respectively. The lead screw nut 64 is clamped into a yoke section 234 by a clamp 236. The yoke section 234 is located with respect to a mount section 238 by a pair of thrust blades 240 and an L-shaped roll blade 242. The thrust blades 240 are coplanar with the lead screw center line 244 and are rigid in the thrust direction and in a vertical bending mode but compliant in a horizontal bending mode. The L-shaped roll blade 242 has a longitudinal portion 246 and a radial portion 248. The longitudinal portion 246 is compliant in a radially directed horizontal bending mode but rigid in a vertical bending mode. The radial portion 248 is compliant in an axially directed horizontal bending mode but also is rigid in a vertical bending mode. The combination is compliant in the yaw direction 228 and rigid in the thrust and roll directions 230 and 232, respectively, as required.

Figure 14:
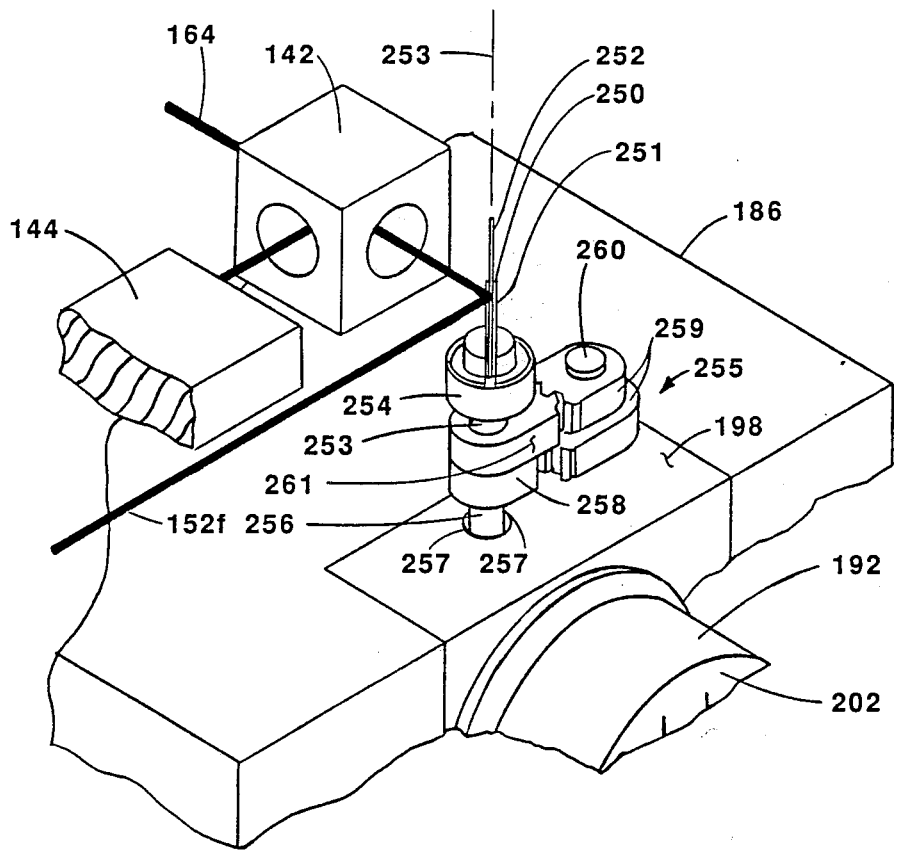
FIG. 14 is an isometric view of a variable angle beam bender mount used to mount one of the beam benders of the improved multi-axis gas bearing stage assembly of FIG. 6, to enable differential control of the intermediate stage element.

If the improved multi-axis gas bearing stage assembly 120 is utilized as the improved multi-axis gas bearing stage assembly 180 then optical coupling between the laser beam path 152f, the interferometer 142 and the measurement beam path 164 must be maintained during differential motion control of the intermediate stage element 186 (which results in angular rotation of the interferometer 142 and the measurement beam path 164 relative to the laser beam path 152f by the angle $\theta$). As shown in FIG. 14, the interferometer 142 is offset from the laser beam path 152f by the introduction of a beam bender 250. A reflective element 252 of the beam bender 250 is mounted on a bar 251 rotatably mounted on the uppermost end of a shaft 253 which is located by a bearing 254. The surface of the reflective element 252 is coincident with the axis of rotation of the shaft 253 which is driven through an angle equal to one-half the angle of rotation of the intermediate stage element 186 (or $\theta/2$) by a 1:2 gear set 255. The 1:2 gear set 255 is driven by the plano-concave, swivelable guideway gas bearing 192 via a shaft 256 whose axis is radially oriented relative to the center 197 of the convex reference surface 196, is mounted on the plano-concave, swivelable gas bearing 192 parallel to the the bearing surface 202, and is constrained in a vertical orientation by surfaces 257 of the intermediate stage element 186. The 1:2 gear set 255 comprises a gear segment 258 fixedly mounted on the shaft 256; a segmented gear cluster 259 rotating about a pin 260 fixedly mounted to the intermediate stage element 186; and a gear segment 261 fixedly mounted to the lowermost end of the shaft 253. In operation, the plano-concave, swivelable gas bearing 192 drives the shaft 256 and the gear segment 258 which drives the segmented gear cluster 259 which, in turn, drives the gear segment 261. The pitch radii of the various gear segments must be chosen so their overall ratio is precisely 1:2 and they must mesh properly as well. One set of pitch radii ratios that satisfies these requirements is 14:21 times 15:20.

Further, when the improved multi-axis gas bearing stage assembly 120 is utilized as the improved multi-axis gas bearing stage assembly 180 the retroreflectors 146 and 148 will not generally be orthogonal to their incident light beams. Thus, it is not possible to use plane mirrors for the retroreflectors 146 and 148. Either roof or corner mirrors may be used.

In FIG. 15, there is shown a graphic drawing depicting the operation of a three dimensional measurement system 189 (which includes the two dimensional measurement system 188) in the differential motion control of the intermediate stage element 186. The value $Y_1$ is measured from reference line 270 to a center of rotation 272, which is coincident with the center 197 of the convex reference surface 196 of the plano-concave, swivelable gas bearing 192. The value $Y_2$ is measured from the reference line 270 to an intersection point 274 of a line 276, through the center of rotaton 272 and parallel to the intermediate stage element 186, and the axis of a second portion 187 of the two dimensional measurement sub-system 188 of the three dimensional measurement system 189. The value $X_i$ is measured from the center of rotation 272 to a line orthogonal to the intermediate stage element 186 through the center 277 of the X-Y-$\theta$ stage 190. The angle $\theta$ is equal to the arctangent of $(Y_1-Y_2)/L$ and the value X is equal to $X_i$ times the cosine of $\theta$.

The flow chart of FIG. 16 outlines the procedure followed to rotationally align a semiconductive wafer.

In the procedure outlined, the angle $\theta$ is made equal to zero and the semiconductive wafer 177 is loaded as shown in FIG. 10A. Then the images of alignment marks 278a and 278b (which are similar to the alignment marks 176a, 176b and 176c) previously printed on either side of the semiconductive wafer 177 are positioned and aligned with the optical alignment sub-assembly 166, shown in FIG. 1, at locations $X_d$ and $Y_d$, and $X_f$ and $Y_f$, respectively. The new angle $\theta$(new) is calculated by the computer 55 through use of the formula $$\theta(\text{new}) = \arctan (Y_f - Y_d)/(X_f - X_d)$$

and then a differential value $\Delta Y$ is calculated by the computer through the use of the formula $$\Delta Y = L \tan \theta(\text{new}).$$

The two dimensional measurement sub-system 188 is then reset to the calculated $\Delta Y$ status and the intermediate stage element 186, the X-Y-$\theta$ stage 190, the chuck 178, and the semiconductive wafer 177 are rotated by the angle, $\theta$(new), as shown in FIG. 10B. Points on the semiconductive wafer 177 may then be located with respect to a point 279 on the semiconductive wafer, which is midway between the alignment marks 278a and 278b. The point 279 is located at the co-ordinates $$X = (X_d + X_f) \cos \theta(\text{new})/2,$$

$$Y = Y_d - (X_d + X_f) \sin \theta(\text{new})/2.$$

Figure 17:
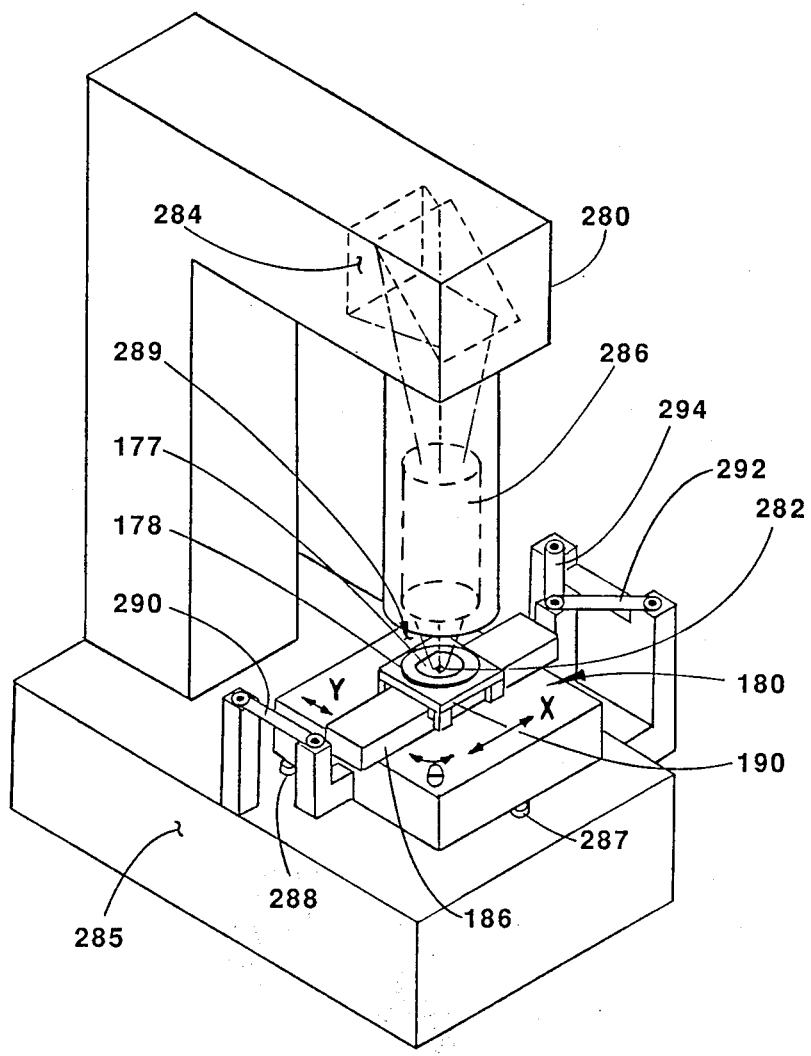
FIG. 17 is an isometric view of an improved multi-axis gas bearing stage assembly mounted within a step-and-repeat camera wherein the improved multi-axis gas bearing stage assembly is located with respect to an optical imaging system of the step-and-repeat camera by a kinematic positioning apparatus having three kinematic constraints coplaner with a semiconductive wafer being processed.

FIG. 17 shows the improved multi-axis gas bearing stage assembly 180 positioned within an alignment and exposure system 280. The alignment and exposure system 280 may comprise the optics apparatus portions of a step-and-repeat camera such as described in U.S. Pat. Nos. 4,357,100 entitled ARRANGEMENT FOR PROJECTION COPYING MASKS ON TO A WORK PIECE and issued Nov. 2, 1982, to Ernst W. Lobach and Herbert E. Mayer, and 4,496,241 entitled PROCESS AND DEVICE FOR RELATIVELY ALIGNING THE IMAGE AND OBJECT SURFACES IN ORTICAL COPYING SYSTEMS and issued Jan. 29, 1985, to Herbert E. Mayer. As described in those patents, an image 282 of a mask 284 is projected by a projection lens 286 onto the semiconductive wafer 177. The semiconductive wafer 177 is mounted on the wafer chuck 178 which is mounted on top of the improved multi-axis gas bearing stage assembly 180. It is necessary to sharply focus the image 282 on the surface of the semiconductive wafer 177. One method of focusing the image comprises supporting the improved gas bearing stage assembly 180 on three servo controlled elevator assemblies 287, 288 and 289 with respect to a frame 285 of the alignment and exposure system 280. The three servo controlled elevator assemblies 287, 288 and 289 then respond to focus error signals (as described fully in U.S. Pat. Nos. 4,357,100 and 4,496,241) and suitably adjust the semiconductive wafer 177 in the Z, pitch and roll directions by moving the improved multi-axis gas bearing stage assembly 180 as a whole. The improved multi-axis gas bearing stage assembly 180 must be constrained from relative motion within the alignment and exposure system 280 such that the semiconductive wafer 177 does not move in the X, Y or yaw ($\theta$) directions during focusing adjustments of the three servo controlled elevator assemblies 287, 288 and 289. This can be done in a passive, kinematic manner with three link members 290, 292 and 294 which are mounted coplaner with the semiconductive wafer. The three link members 290, 292 and 294 effectively form a mutually orthogonal set of coplaner constraints that so restrain the improved multi-axis gas bearing stage assembly 180.

Figure 18:
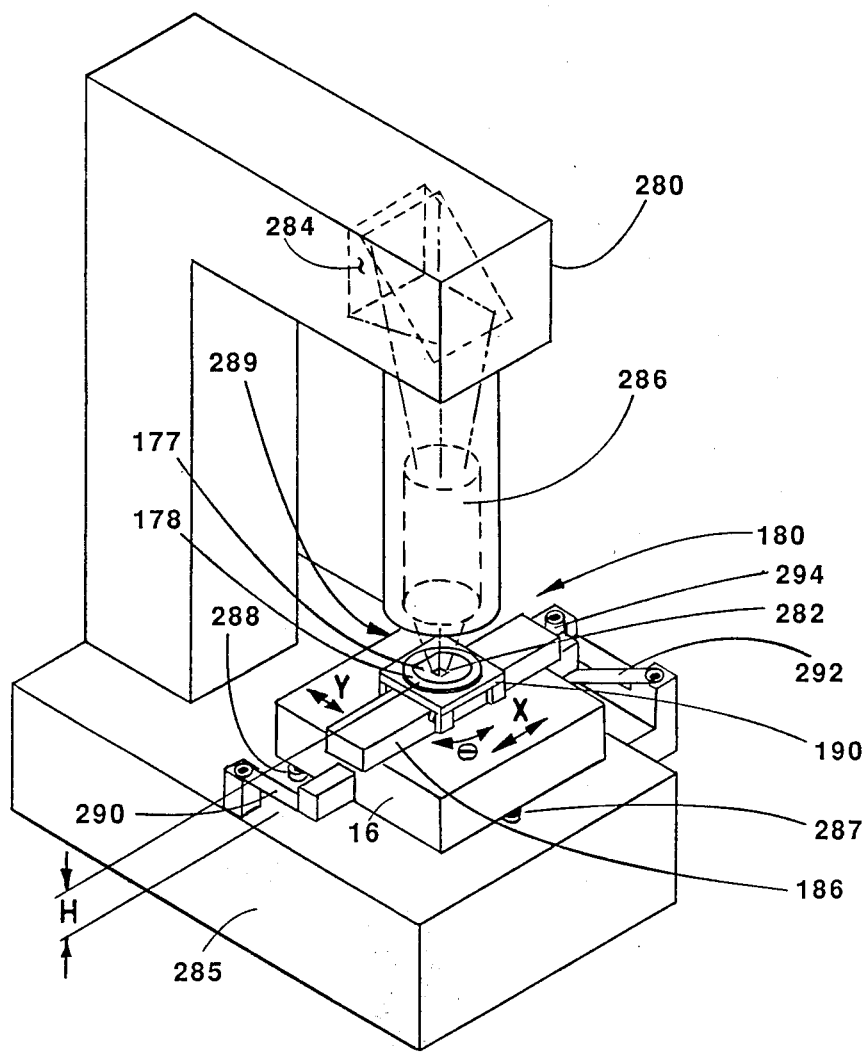
FIG. 18 is an isometric view of an improved multi-axis gas bearing stage assembly mounted within a step-and repeat camera wherein the improved multi-axis gas bearing stage assembly is positioned with respect to the optical imaging system of the step-and-repeat camera by software computation.

In some cases it may not be possible to mount the the link members 290, 292 and 294 coplaner with the semiconductive wafer 177 because of volumetric space constraints. FIG. 18 shows the improved multi-axis stage assembly 180 positioned in the alignment and exposure system 280 with the link members 290, 292 and 294 mounted in a plane that is parallel with the plane of the semiconductive wafer 177 but located below that plane by a distance H. With the link members mounted in this manner, the X and Y axes locations of the semiconductive wafer 177 are subject to an Abbe offset error proportional to the separation of the planes of the link members and the semiconductive wafer. FIGS. 19A and 19B are graphic drawings that illustrate Y direction and X direction Abbe offset errors, $\delta Y$ and $\delta X$, respectively. The three servo controlled elevator assemblies 287, 288 and 289 are located radially at a distance R from an extension of the optic axis of the projection lens 286 and they are equally spaced at 120°. The servo controlled elevator assemblies are positioned with assembly 287 in front, assembly 288 to the left, and assembly 289 to the right. They are vertically located at distances $Z_1$, $Z_2$ and $Z_3$, respectively, from a datum plane 295. A pitch angle, $\gamma$, and a roll angle, $\phi$, can be found from the following equations:

$$\gamma \simeq (Z_2 + Z_3 - 2Z_1)/3R \text{ and}$$

$$\phi \simeq (Z_2 - Z_3)/\sqrt{3}\ (R).$$

The resulting Abbe offset errors $\delta Y$ and $\delta X$ can be found from the following equations:

$$\delta Y \simeq H(\gamma)$$

and $$\delta X \simeq H(\phi).$$

These Abbe offset errors can be countermanded by adding $-\delta Y$ and $-\delta X$ address offsets to the nominal end point addresses $Y_e$ and $X_e$ for final positioning of the X-Y-$\theta$ stage 190.

FIG. 20 is a flow chart that outlines the procedure followed in positioning an X-Y-$\theta$ stage 190 that is mounted in an alignment and exposure system 280 as shown in FIG. 18. The X-Y-$\theta$ stage 190 is positioned at the nominal end point addresses, $Y_e$ and $X_e$. The image 282 is focused by positioning the semiconductive wafer 177 in the Z, pitch and roll directions via suitably positioning the servo controlled elevator assemblies 287, 288 and 289. The Abbe offset errors $\delta Y$ and $\delta X$ are calculated. Finally, the $-\delta Y$ and $-\delta X$ address offsets are added to the nominal end point addresses as described above, and the X-Y-$\theta$ stage 190 moves to its corrected end point as desired.

Figure 21:
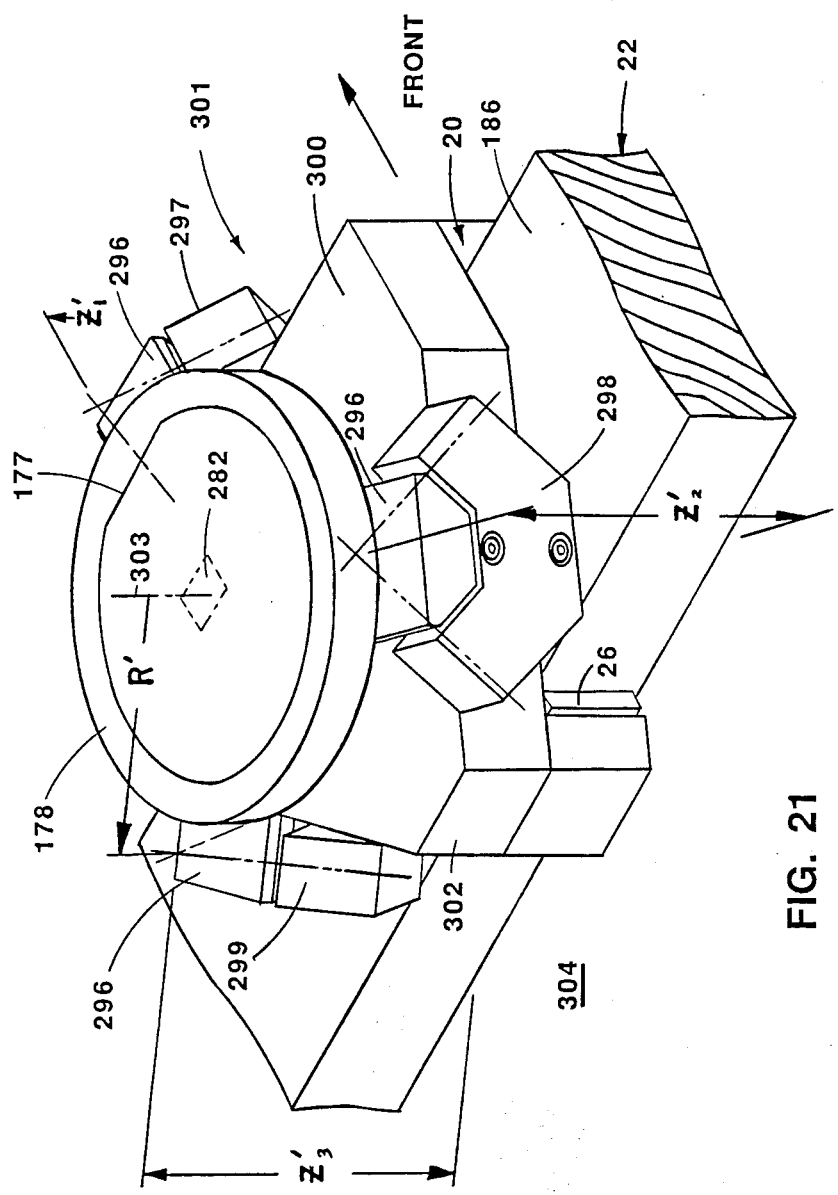
FIG. 21 is an isometric view of a kinematically mounted chuck mounting spider for supporting a wafer chuck of the improved multi-axis gas bearing stage assembly.

FIG. 21 shows an alternative focusing and leveling mechanism for focusing the image 282 on the surface of the semiconductive wafer 177. As shown in FIG. 21 the wafer chuck 178 is mounted on a chuck mounting spider 296 which is positioned above an X-Y-$\theta$ stage 300 by a kinematic positioning apparatus 301. One example of a suitable kinematic positioning apparatus is described thoroughly in copending and incorporated U.S. patent application Ser. No. 692,011. Described is a system utilizing the chuck mounting spider 296 as a free floating support platform, having six degrees of freedom, which is mounted on a computer controlled subsystem of three positioning sets 297, 298 and 299. Each positioning set comprises two linear motors and two position measuring transducers wherein a common measurement locus of the two position measuring transducers coincides with the plane containing the image 282. A detailed description of this focusing and leveling system's operation is presented in U.S. patent application Ser. No. 692,011, with particular reference to FIGS. 1, 15, 18A, 18B, 18C, 19, 20A, 20B, 26A and 26B.

The X-Y-$\theta$ stage 300 is shaped in a generally triangular manner to facilitate mounting of the three positioning sets 297, 298 and 299 onto the X-Y-$\theta$ stage 300. The axially loaded guideway gas bearing assemblies 26 (used to force the guideway gas bearings 20 into juxtaposition with the edge reference surface 22 of the intermediate stage element 186) are located adjacent to one another under an apex portion 302 of the generally triangularly shaped X-Y-$\theta$ stage 300. The three positioning sets 297, 298 and 299 are located with positioning set 297 in front, positioning set 298 to the left, and positioning set 299 to the right. They are located radially at a distance R' from a central vertical axis 303 and equally spaced at 120°.

The kinematic positioning apparatus 301 performs the focusing and leveling functions described hereinabove and keeps the center of the semiconductive wafer 177 located on the vertical axis 303 with respect to the X-Y-$\theta$ stage 300 action of the positioning sets 297, 298 and 299. The kinematic positioning apparatus 301 also presents three output signals that are representative of three vertical distances $Z_1'$, $Z_2'$ and $Z_3'$ from a datum plane 304 to the chuck mounting spider 296 at the locations of the positioning sets 297, 298 and 299, respectively.

Figure 22:
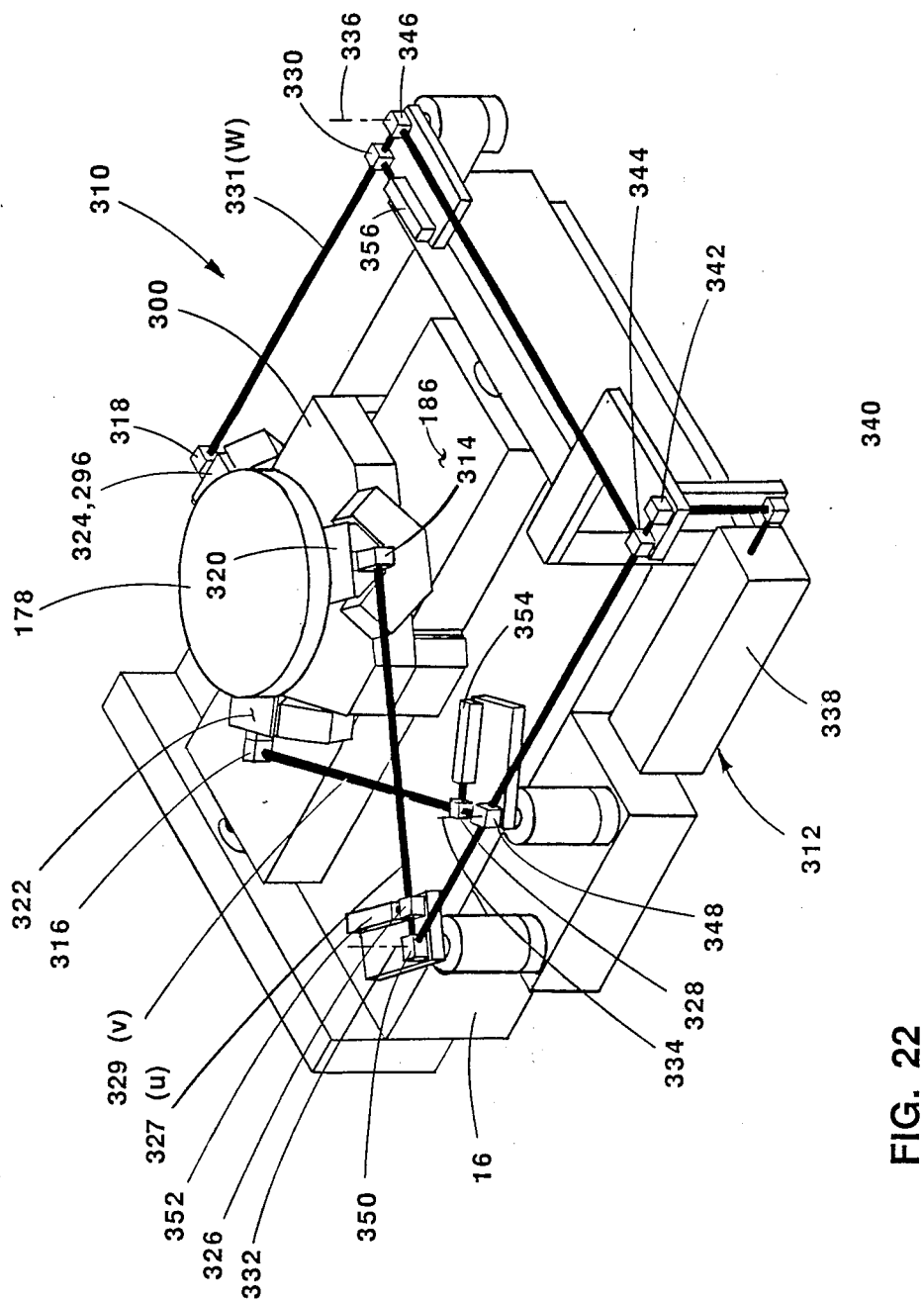
FIG. 22 is an isometric view of an improved multi-axis gas bearing stage assembly wherein the location of the chuck mounting spider is directly controlled by a three axis interferometer measuring system.

The X-Y-$\theta$ stage 300 and the kinematic positioning apparatus 301 may be used with any of the aforementioned improved multi-axis gas bearing stage assemblies 10, 70, 120 or 180, for focusing and leveling a semiconductive wafer 177. Alternately, they may be used with a direct type of interferometer control which is similar to that described in copending and incorporated U.S. patent application Ser. No. 792,436. FIG. 22 shows an improved multi-axis gas bearing stage assembly 310 wherein the position of the X-Y-$\theta$ stage 300 is controlled by such a direct type of interferometer control system. In the multi-axis gas bearing stage assembly 310 a three-axis interferometer measuring system 312 is used. It features three retroreflectors 314, 316 and 318 which are mounted directly on each of three arms 320, 322 and 324, respectively, of the chuck mounting spider 296. The three-axis interferometer measuring system 312 measures the position of the chuck mounting spider 296 at the plane of the retroreflectors 314, 316 and 318 (see $\delta Y'$ and $\delta X'$ offset errors, below) relative to the base 16 of the improved multi-axis gas bearing stage assembly 310. Three gas bearing spindle mounted interferometers 326, 328 and 330 measure three distances, U, V and W, along three interferometer distance measuring paths, 327, 329 and 331, respectively, between gas bearing spindle axes 332, 334 and 336 and the retroreflectors 314, 316 and 318, respectively. Since the chuck mounting spider 296 is subject to pitch, roll and yaw ($\theta$)

motions, the retroreflectors 314, 316 and 318 can not be orthogonally oriented to their incident light beams in any direction, and therefore, only corner mirrors should be used.

The three-axis interferometer measuring system 312 comprises the following: A laser source 338, beam benders 340 and 342, and a 33% beam splitter 344 which are fixedly mounted on the base 16. One-third of the light from the laser source 338 is reflected by the 33% beam splitter 344 to a beam bender 346 mounted coincident with the gas bearing spindle axis 336 and the remaining two-thirds is transmitted to a 50% beam bender 348 mounted coincident with the gas bearing spindle axis 334. One-half of the light incident upon the 50% beam splitter 348 is transmitted to a beam bender 350 mounted coincident with the gas bearing spindle axis 332. Thus, equal amounts of light are reflected from the beam bender 346, 50% beam splitter 348 and beam bender 350. Further, each of them has its reflective surface mounted coincident with its respective gas bearing spindle axis on a shaft that rotates through half the angle of its respective gas bearing spindle. Thus, the light transmitted from the beam bender 350, 50% beam splitter 348 and beam bender 346 is coupled to the interferometers 326, 328 and 330, the measuring paths 327, 329 and 331, and receivers 352, 354 and 356, respectively.

Figure 23:
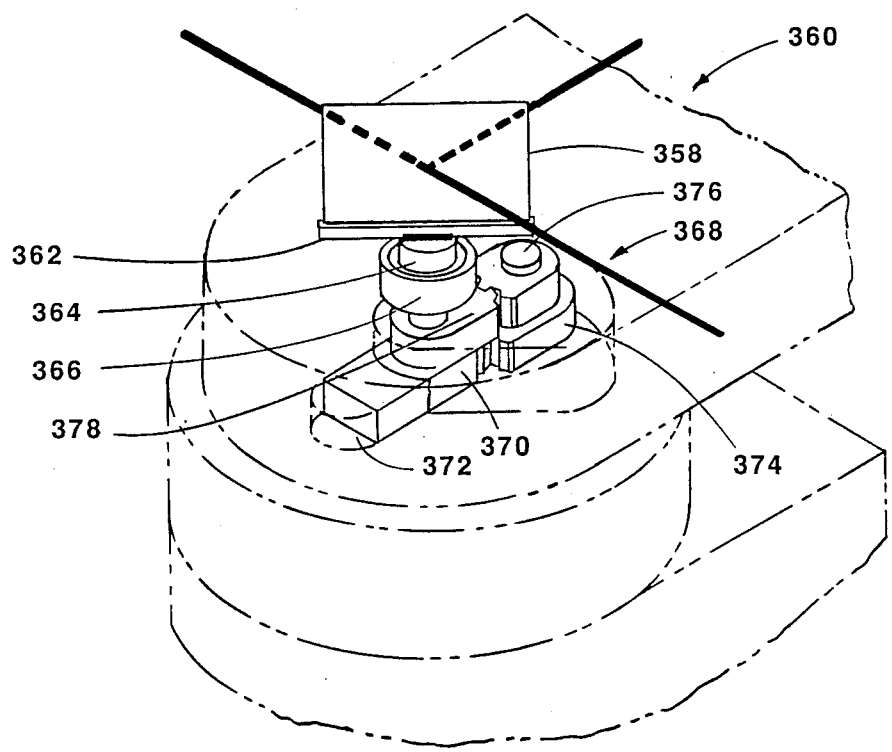
FIG. 23 is an isometric view of a variable angle beam bender mount used with gas bearing spindle mounted interferometers of the improved multi-axis gas bearing stage assembly of FIG. 22 to enable rotation of the interferometers.

As shown in FIG. 23, the reflective surface of a suitably coated reflective element 358 of of the beam bender 350, 50% beam splitter 348, or beam bender 346 is located such that the gas bearing spindle axis 332, 334 or 336, respectively, is coplaner with the reflective plane. Also, the reflective element 358 is rotated by one-half the angle of rotation of the respective spindle, as described above. FIG. 23 shows a variable angle beam splitter or bender mount 360 wherein the reflective element 358 is mounted on a bar 362 rotatably mounted on the uppermost end of a shaft 364 via a bearing 366. The shaft 364 is driven through an angle equal to one-half the angle of the spindle by a 1:2 gear set 368. The 1:2 gear set 368 comprises a gear segment 370 located in a slot 372 formed in the spindle and rotating with the spindle; a segmented gear cluster 374 rotating about a pin 376 fixedly mounted to the non-rotating body of the spindle; and a gear segment 378 fixedly mounted to the lowermost end of the shaft 364. In operation, the spindle drives the gear segment 370 which drives the segmented gear cluster 374 which, in turn, drives the gear segment 378. The pitch radii of the various gear segments must be chosen so their overall ratio is precisely 1:2 and they must mesh properly as well. One set of pitch radii ratios that satisfies these requirements is 14:21 times 15:20.

In operation, the U, V and W measurements to a desired position of the chuck mounting spider 296, along the X, Y and $\theta$ axes of motion, are calculated by a computer 380 from a desired X-Y-$\theta$ position address. The desired Y and X locations associated with that address are effected by Abbe offset measurement errors as follows: While the plane of the retroreflectors 314, 316 and 318 is parallel to the plane of the semiconductive wafer 177 when the three vertical distances $Z_1'$, $Z_2'$ and $Z_3'$ are equal, the two planes are separated from each other by a distance H'. Thus, when the three vertical distances $Z_1'$, $Z_2'$ and $Z_3'$ are not equal, the actual position of the semiconductive wafer 177 along the Y and X axes of motion is offset from the measured position of the plane of the retroreflectors 314, 316 and 318.

The resulting $\delta Y'$ and $\delta X'$ offset errors can be found as follows: A pitch angle, $\gamma'$, and a roll angle, $\phi'$, are found via $$\gamma' \simeq (Z_2' + Z_3' - 2Z_1')/3R' \text{ and}$$

$$\phi' \simeq (Z_2' - Z_3')/\sqrt{3}\ (R'),$$

and the $\delta Y'$ and $\delta X'$ offset errors ar determined by $$\delta Y' \simeq H'(\gamma')$$

and $$\delta X' \simeq H'(\phi').$$

These offset errors can be countermanded by adding $-Y'$ and $-X'$ address offsets to the nominal desired position addresses for the chuck mounting spider 296. Finally, a servo controller 382 drives the first and second Y-axis linear motors 84 and 86 and the X-axis linear motor 98 so as to position the chuck mounting spider 296 at U, V and W measurements, calculated by the computer 380, from an offset (Y-$\delta Y'$)-(X-$\delta X'$)-$\theta$ address, generally as explained in U.S. patent application Ser. No. 792,436.

Figure 24:
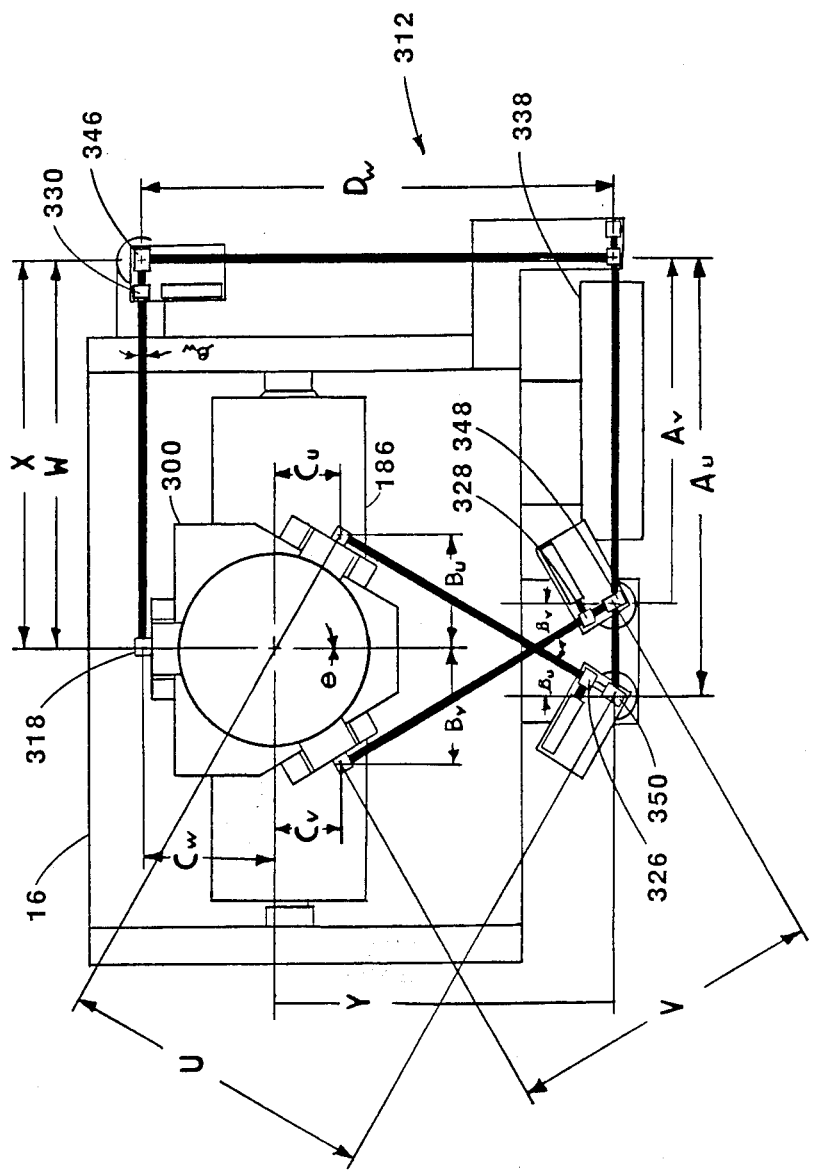
FIG. 24 is a plan view of the improved multi-axis gas bearing stage assembly of FIG. 22 showing three interferometer measuring paths used for locating the position of the chuck mounting spider.

The differences between the actions of the computer 380 and the servo controller 382 and those of the comparable computer and servo controller of U.S. patent application Ser. No. 792,436 are illustrated in FIG. 24. The lateral area configuration of the retroreflectors, 314, 316 and 318, and the gas bearing spindle axes, 332, 334 and 336, are different (than the lateral area configuration of the equivalent components shown in U.S. patent application Ser. No. 792,436) in that the retroreflector 318 and the gas bearing spindle axis 336 are relocated relative to the positions of similar components of U.S. patent application Ser. No. 792,436. Thus, slightly modified formulas for computing the U, V and W measurement distances are required. U, V and W are determined herein by $$U = (Y - C_u\cos\theta - B_u\sin\theta)/\cos \arctan[(-X +$$

$$A_u + B_u\cos\theta - C_u\sin\theta)/(Y - C_u\cos\theta - B_u\sin\theta)],$$

$$V = (Y - C_v\cos\theta + B_v\sin\theta)/\cos \arctan[(X - A_v +$$

$$B_v\cos\theta + C_v\sin\theta)/(Y - C_v\cos\theta + B_v\sin\theta)]$$

and $$W = (X - C_w\sin\theta)/\cos \arctan[(Y +$$

$$C_w\cos\theta - D_w)/(X - C_w\sin\theta)],$$

where Y, $\theta$ and X are the desired position values of the chuck mounting spider 296 along the Y, $\theta$ and X axes of motion, respectively, $A_u$ and $A_v$ are the values of the X-direction coordinates of the spindle axes 332 and 334, respectively, $B_u$ and $B_v$ are the values of the X-direction offsets of the retroreflectors 314 and 316, respectively, $C_u$, $C_v$ and $C_2$ are the values of the Y-direction offsets of the retroreflectors 314, 316 and 318, respectively, and $D_w$ is the value of the Y-direction coordinate of the spindle axis 336.

Similarly, three computed velocity errors, $dY/dt'$, $d\theta/dt'$ and $dX/dt'$, used by the control circuit of U.S.

patent application Ser. No. 792,436 are determined herein as follows:

$$dY/dt' = (dU/dt_2)\cos\beta_u + (dV/dt_2)\cos\beta_v + (dW/dt_2)\sin\beta_w,$$

$$d\theta/dt' = - (1/r_u)(dU/dt_2) + (1/r_v)(dV/dt_2) - (1/r_w)(dW/dt_2)$$

and $$dX/dt' = - (dU/dt_2)\sin\beta_u + (dV/dt_2)\sin\beta_v + (dW/dt_2)\cos\beta_w,$$

where $dU/dt_2$, $dV/dt_2$ and $dW/dt_2$ are velocity error signals relative to the U, V and W measurement directions, respectively, measured by the three-axis interferometer, measuring system 312, $\beta_u$, $\beta_v$ and $\beta_w$ are the angles between the measuring paths 327, 329 and 331 and directions parallel to the Y-axis or X-axis, respectively, and $r_u$, $r_v$ and $r_w$ are determined herein by the following set of equations:

$$r_u = (C_u\cos\theta + B_u\sin\theta)\sin\beta_u + (B_u\cos\theta - C_u\sin\theta)\cos\beta_u,$$

$$r_v = (C_v\cos\theta - B_v\sin\theta)\sin\beta_v + (B_v\cos\theta + C_v\sin\theta)\cos\beta_v$$

and $$r_w = (C_w\cos\theta)\cos\beta_w + (C_u\sin\theta)\sin\beta_w.$$

Figure 25:
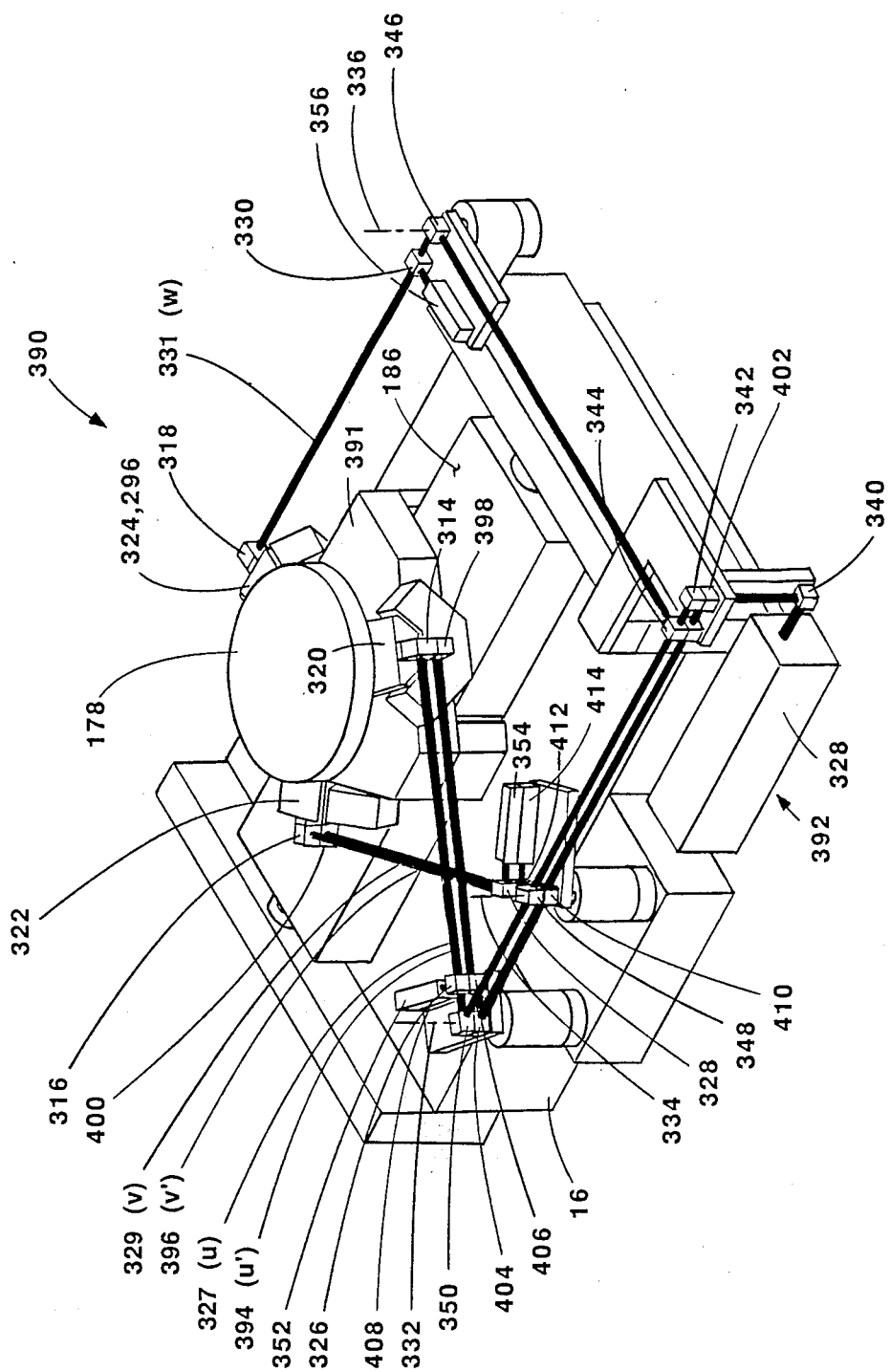
FIG. 25 is an isometric view of an improved multi-axis gas bearing stage assembly wherein the location of the chuck mounting spider is directly controlled by a five axis interferometer measuring system that positions the chuck mounting spider in the Y, X, pitch, roll and yaw ($\theta$) directions.

Even the improved multi-axis gas bearing stage assembly 310 is subject to minute Abbe offset errors in the Y and X directions. This is because the retroreflectors 314, 316 and 318 are mounted below the plane of the semiconductive wafer 177, and concomitantly, minute imperfections in the surface geometries of the top reference surface 14, of the base 16, and the top reference surface 12, of the intermediate stage element 24, cause minute rotations in the pitch and roll directions, not accounted for hereinbefore. FIG. 25 shows an improved multi-axis stage assembly 390 wherein the location of an X-Y-$\theta$ stage 391 is controlled by a five axis interferometer measuring system 392. The five axis interferometer measuring system 392 controls motions of the X-Y-$\theta$ stage 391 in the Y, X and $\theta$ directions as determined by measurements U, V and W along the three interferometer distance measuring paths 327, 329 and 331 to the three retroreflectors 314, 316 and 318, respectively, as modified by measurements U' and V' along additional interferometer distance measuring paths 394 and 396 to additional retroreflectors 398 and 400, respectively.

The five-axis interferometer measuring system 392 comprises all of the optical components of the three-axis interferometer measuring system 312; a 40% beam splitter 402 fixedly mounted on the base 16; an additional beam bender 404, interferometer 406 and receiver 408 mounted underneath the beam bender 350, interferometer 326 and receiver 352, respectively; an additional 50% beam splitter 410, interferometer 412 and receiver 414 mounted underneath the 50% beam splitter 348, interferometer 328 and receiver 354, respectively; and the afore-mentioned retroreflectors 398 and 400. Thus, equal amounts of light are transmitted from the beam bender 350, beam bender 404, 50% beam splitter 348, 50% beam splitter 410 and beam bender 346, and the light transmitted from the beam bender 404 and 50% beam splitter 410 is coupled to the interferometers 406 and 412, the measuring paths 394 and 396, and receivers 408 and 414, respectively.

As mentioned above, the measurements U' and V' along the interferometer measuring paths 394 and 396, respectively, are used to modify the U, V and W measurements, respectively. The modifications, $\delta U$, $\delta V$ and $\delta W$, to the U, V and W measurements required to position the semiconductive wafer at its desired U, V and W locations, respectively, are determined as follows:

$$\delta U = (n_u/m)(U - U'),$$

$$\delta V = (n_v/m)(V - V')$$

and $$\delta W = \delta U(n_w/n_u)\sin(-\beta_u + \beta_w) + \delta V(n_w/n_v)\sin(-\beta_v - \beta_w),$$

where m is the vertical separation distance between the retroreflectors 314 and 398, and 316 and 400, respectively, and $n_u$, $n_v$ and $n_w$ are the actual vertical separation distances between each of the retroreflectors 314, 316 and 318, respectively, and the plane of the semiconductive wafer 177. The vertical separation distances, $n_u$, $n_v$ and $n_w$, may be computed by the formulas $$n_u = H' + [(1.5R' + r')(Z_1' - Z_0') +$$

$$(r')(Z_2')(Z_2' + Z_3' - 2Z_0')/2]/1.5R',$$

$$n_v = H' + [(1.5R' + r')(Z_2' - Z_0') +$$

$$(r')(Z_3' + Z_1' - 2Z_0')/2]/1.5R'$$

and $$n_w = H' + [(1.5R' + r')(Z_3' - Z_0') +$$

$$(r')(Z_3' + Z_1' - 2Z_0')/2]/1.5R',$$

where H' is the nominal separation value of the vertical separation distances $n_u$, $n_v$ and $n_w$, $Z_0'$ is a reference value for the vertical distances $Z_1'$, $Z_2'$ and $Z_3'$ respectively, and r' is the radial distance between any of the positioning sets 297, 298 or 299, and the retroreflectors 314, 316 or 318, respectively, as shown in FIG. 24. The modified final values, U'', V'' and W'', of the U, V and W measurements, respectively, are determined as follows:

$$U''=U-\delta U,$$

$$V''=V-\delta V$$

and $$W''=W-\delta W.$$

Figure 26:
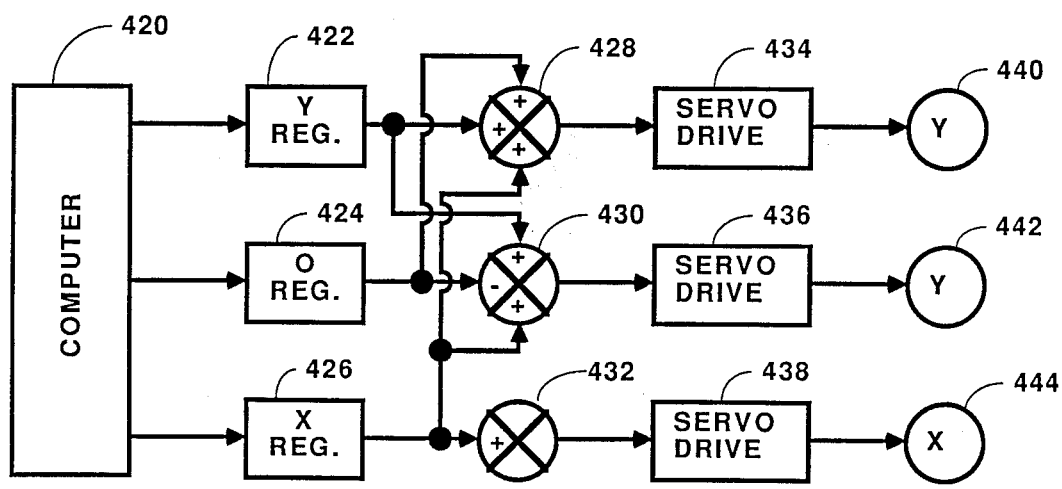
FIG. 26 is a modified section of an output portion of a contral circuit used to control drive motors of the improved multi-axis gas bearing stage assemblies of FIGS. 22 and 25.

Since the X-Y-$\theta$ linear motor of copending and incorporated U.S. patent application Ser. No. 792,436 has four independent linear motor portions and the multi-axis stage assemblies described herein have three motors, the output portions of the control circuit shown in FIG. 16 of U.S. patent application Ser. No. 792,436 differ herein as well. FIG. 26 shows a modified section of the output portion of the control circuit. A computer 420 calculates velocity errors, dY/dt', d$\theta$/dt' and dX/dt' as explained in U.S. patent application Ser. No. 792,436, and sequentially stores them in a Y register 422, a $\theta$ register 424 and an X register 426, respectively. The output signals of the three registers are applied to selected ones of three summing circuits 428, 430 and 432 as follows: The output signal from the Y register 422 is applied to positive input terminals of the summing circuits 428 and 430. The output signal from the $\theta$ register 424 is applied to a positive input terminal of the summing circuit 428 and a negative terminal of the summing circuit 430. And, the output signal from the X register 426 is applied to positive terminals of the summing circuits 428, 430 and 432. The output signals of the summing circuits 428, 430 and 432 are applied to servo drive circuits 434, 436 and 438, respectively, for driving a $Y_1$ motor 440, a $Y_2$ motor 442 and an $X_i$ motor 444, respectively, where the $Y_1$ motor 440, $Y_2$ motor 442, and $X_i$ motor 444 comprise a set of drive motors for either of the improved multi-axis gas bearing stage assemblies 310 or 390.

I claim:

1. An X-Y stage apparatus comprising:
   a base for guiding said X-Y stage apparatus along a Y-direction and supporting said X-Y stage apparatus along an orthogonal Z-direction;
   stage means for holding a workpiece;
   intermediate stage means for guiding said stage means along an X-direction orthogonal to both said Y-direction and said Z-direction, and supporting said stage means in said Z-direction, said intermediate stage means being oriented orthogonally with respect to said Y-axis, and having a first end and a second end opposite said first end;
   bearing means for guiding said first end of said intermediate stage means along said Y-direction with respect to said base;
   X-axis drive means for moving said stage means along said intermediate stage means in said X-direction;
   first Y-axis drive means, positioned proximate to said first end of said intermediate stage means, for moving said intermediate stage means in said Y-direction;
   second Y-axis drive means, positioned proximate to said second end of said intermediate stage means, for moving said intermediate stage means in said Y-direction, said second Y-axis drive means operable independently of said first Y-axis drive means; and
   control means for controlling said first Y-axis drive means and said second Y-axis drive means to maintain said orthogonal orientation of said intermediate stage means with respect to said Y-axis.

2. An apparatus as in claim 1 wherein said intermediate stage means has a substantially flat top surface, and first and second substantially flat edge surfaces substantially parallel to said X-direction, and wherein said stage means is guided and supported with respect to said intermediate stage means by gas bearing means.

3. An apparatus as in claim 2 wherein said supporting gas bearing means are vacuum stabilized gas bearing means.

4. An apparatus as in claim 2 wherein said first substantially flat edge surface is used as a reference surface for guideway gas bearing means, and wherein said second substantially flat edge surface is used with axially loaded gas bearing means to pre-load said guideway gas bearing means against said first substantially flat edge surface.

5. An apparatus as in claim 2 wherein said base means has a substantially flat top surface, and first and second substantially flat edge surfaces substantially parallel to said Y-direction, and wherein said intermediate stage means is guided by guideway gas bearing means and supported by supporting gas bearing means with respect to said base means.

6. An apparatus as in claim 5 wherein said supporting gas bearing means are vacuum stabilized gas bearing means.

7. An apparatus as in claim 5 wherein said first substantially flat edge surface is used as a reference surface for said guideway gas bearing means, and wherein said second substantially flat edge surface is used with axially loaded gas bearing means to pre-load said guideway gas bearing means against said first substantially flat edge surface.

8. An apparatus as in claim 5 wherein said first substantially flat edge surface is used to mount a first substantially flat side plate which is used as a reference surface for said guideway gas bearing means, and wherein said second surface is used to mount a second substantially flat side plate which is used with axially loaded gas bearing means to pre-load said guideway gas bearing means against said first substantially flat side plate.

9. An apparatus as in claim 5 wherein said guideway gas bearing means comprises a single gas bearing.

10. An apparatus as in claim 1 wherein said first Y-axis drive means comprises a first Y-axis motor and a first Y-axis measuring means for determining a location in said Y-direction of said first end of said intermediate stage means, and wherein said second Y-axis drive means comprises a second Y-axis motor and a second Y-axis measuring means for determining a location in said Y-direction of said second end of said intermediate stage means.

11. An apparatus as in claim 1 wherein said X-axis drive means comprises an X-axis motor and an X-axis measuring means for determining a location in said X-direction of said stage means.

12. An apparatus as in claim 10 wherein said first Y-axis measuring means comprises a first Y-axis motor-encoder and wherein said second Y-axis measuring means comprises a second Y-axis motor-encoder.

13. An apparatus as in claim 11 wherein said X-axis measuring means comprises an X-axis motor-encoder.

14. An apparatus as in claim 10 wherein said first Y-axis motor comprises a first linear motor and wherein said second Y-axis motor comprises a second linear motor.

15. An apparatus as in claim 11 wherein said X-axis motor comprises a linear motor.

16. An apparatus as in claim 10 wherein said first Y-axis measuring means and said second Y-axis measuring means each comprise a measuring scale and a read head.

17. An apparatus as in claim 11 wherein said X-axis measuring means comprises a measuring scale and a read head.

18. An apparatus as in claim 10 wherein said first Y-axis measuring means and said second Y-axis measuring means each comprise an interferometer and a retroreflector.

19. An apparatus as in claim 11 wherein said X-axis measuring means comprises an interferometer and a retroreflector.

20. A method of achieving orthgonality between X and Y axes of motion in an apparatus having an X-Y stage located with respect to a first Y-axis positioning elememt and a second Y-axis positioning element spaced apart by a distance L, comprising the steps of:
   a. recording a position $Y_1$(old) corresponding to a Y-axis coordinate of said first Y-axis positioning element relative to a first reference, and recording a position Y₂(old) corresponding to a Y-axis coordinate of said second Y-axis positioning element relative to a second reference;

b. Calculating a differential value, Y(old), defined by $$\delta Y(\text{old}) = Y_1(\text{old}) - Y_2(\text{old});$$

c. aligning a first alignment mark on said X-Y stage with a measurement standard while keeping δY(old) a constant;

d. measuring X and Y displacement between said first alignment mark and said measurement standard, said measurements hereinafter called $\delta X_a$ and $\delta Y_a$;

e. aligning a second alignment mark on said X-Y stage with said measurement standard while keeping δY(old) a constant, said second alignment mark being displaced a distance l in the X-direction from said first alignment mark;

f. measuring X and Y displacement between said first alignment mark and said measurement standard, said measurements hereinafter called $\delta X_b$ and $\delta Y_b$;

g. aligning a third alignment mark on said X-Y stage with said measurement standard while keeping δY(old) a constant, said third alignment mark being displaced a distance l in the Y-direction from said second alignment mark;

h. measuring X and Y displacement between said first alignment mark and said measurement standard, said measurements hereinafter called $\delta X_c$ and $\delta Y_c$;

i. calculating an orthogonality error angle, δθ, defined by $$\delta\theta = (\delta Y_b - \delta Y_a + \delta X_b - \delta X_c)/l;$$

j. calculating a differential value, δY(new), defined by $$\delta Y(\text{new}) = \delta Y(\text{old}) - L\delta\theta,$$

where $$\delta Y(\text{new}) = Y_1(\text{new}) - Y_2(\text{new}),$$

where Y₁(new) is a new Y-axis coordinate for said first Y-axis positioning element, and Y₂(new) is a new Y-axis coordinate for said second Y-axis positioning element; and k. moving said first and second Y-axis positioning elements to Y₁(new) and Y₂(new), respectively, to reduce δθ to zero.

21. An X-Y-θ stage apparatus comprising:

a base for guiding said X-Y-θ stage apparatus along an Y-direction and supporting said X-Y-θ stage apparatus along an orthogonal Z-direction;

stage means for holding a workpiece;

intermediate stage means for guiding said stage means along an X-direction orthogonal to said Z-direction and approximately orthogonal to said Y-direction, and supporting said stage means in said Z-direction, said intermediate stage means being oriented in said approximately orthogonal direction with respect to said Y-axis, and having a first end and a second end opposite said first end;

bearing means for guiding said first end of said intermediate stage means along said Y-direction with respect to said base;

$X_i$-axis drive means for moving said stage means along said intermediate stage means in said $X_i$-direction;

first Y-axis drive means, positioned proximate to said first end of said intermediate stage means, for moving said intermediate stage means in said Y-direction;

second Y-axis drive means, positioned proximate to said second end of said intermediate stage means, for moving said intermediate stage means in said Y-direction, said second Y-axis drive means operable independently of said first Y-axis drive means; and control means for controlling said first Y-axis drive means and said second Y-axis drive means for moving said intermediate stage means along a θ-direction, measured from an X-direction orthogonal to both said Y-direction and said Z-direction, about said Z-direction in a plane of motion comprising said X-direction and said Y-direction.

22. An apparatus as in claim 21 wherein said control means is additionally for controlling both said first and second Y-axis drive means, and said $X_i$-axis drive means, for moving said stage means in said X-direction.

23. An apparatus as in claim 21 wherein said intermediate stage means has a substantially flat top surface, and said first and second substantially flat edge surfaces substantially parallel to said $X_i$-direction, and wherein said stage means is guided and supported with respect to said intermediate stage means by gas bearing means.

24. An apparatus as in claim 23 wherein said supporting gas bearing means are vacuum stabilized gas bearing means.

25. An apparatus as in claim 23 wherein said first substantially flat edge surface is used as a reference surface for guideway gas bearing means, and wherein said second substantially flat edge surface is used with axially loaded gas bearing means to pre-load said guideway gas bearing means against said first substantially flat edge surface.

26. An apparatus as in claim 23 wherein said base means has a substantially flat top surface, and first and second substantially flat edge surfaces substantially parallel to said Y-direction, and wherein said intermediate stage means is guided by guideway gas bearing means and supported by supporting gas bearing means with respect to said base means.

27. An apparatus as in claim 26 wherein said supporting gas bearing means are vacuum stabilized gas bearing means.

28. An apparatus as in claim 26 wherein said first substantially flat edge surface is used as a reference surface for said guideway gas bearing means, and wherein said second substantially flat edge surface is used with axially loaded gas bearing means to pre-load said guideway gas bearing means against said first substantially flat edge surface.

29. An apparatus as in claim 26 wherein said first substantially flat edge surface is used to mount a first substantially flat side plate which is used as a reference surface for said guideway gas bearing means, and wherein said second surface is used to mount a second substantially flat side plate which is used with axially loaded gas bearing means to pre-load said guideway gas bearing means against said first substantially flat side plate.

30. An apparatus as in claim 26 wherein said guideway gas bearing means comprises a single gas bearing.

31. An apparatus as in claim 30 wherein said single gas bearing is a swivelable gas bearing.

32. An apparatus as in claim 31 wherein said swivelable gas bearing comprises a plano gas bearing surface disposed opposite said first substantially flat edge surface of said base, or said first substantially flat side plate, and a concave gas bearing surface disposed on a convex reference surface located on said intermediate stage means.

33. An apparatus as in claim 21 wherein said first Y-axis drive means comprises a first Y-axis motor and a first Y-axis measuring means for determining a location in said Y-direction of said first end of said intermediate stage means, and wherein said second Y-axis drive means comprises a second Y-axis motor and a second Y-axis measuring means for determining a location in said Y-direction of said second end of said intermediate stage means.

34. An apparatus as in claim 21 wherein said $X_i$-axis drive means comprises an $X_i$-axis motor and an $X_i$-axis measuring means for determining a location in said $X_i$-direction of said stage means.

35. An apparatus as in claim 33 wherein said first Y-axis measuring means comprises a first Y-axis motor-encoder and wherein said second Y-axis measuring means comprises a second Y-axis motor-encoder.

36. An apparatus as in claim 34 wherein said $X_i$-axis measuring means comprises an $X_i$-axis motor-encoder.

37. An apparatus as in claim 33 wherein said first Y-axis motor comprises a first linear motor and wherein said second Y-axis motor comprises a second linear motor.

38. An aparatus as in claim 34 wherein said $X_i$-axis motor comprises a linear motor.

39. An apparatus as in claim 33 wherein said first Y-axis measuring means and said second Y-axis measuring means each comprise a measuring scale and a read head.

40. An apparatus as in claim 34 wherein said $X_i$-axis measuring means comprises a measuring scale and a read head.

41. An apparatus as in claim 33 wherein said first Y-axis measuring means and said second Y-axis measuring means each comprise an interferometer and a retroreflector.

42. An apparatus as in claim 34 wherein said $X_i$-axis measuring means comprises an interferometer and a retroreflector.

43. An X-Y-$\theta$ stage apparatus as in claim 21 additionally comprising:
chuck means for holding said workpiece;
free floating support means for supporting said chuck means, said support means located with respect to six degrees of freedom by three positioning sets, each positioning set locating said free floating support means in two of said six degrees of freedom.

44. An apparatus as in claim 43 wherein each positioning set comprises two linear motors and two position measuring transducers, and further wherein a common measurement locus of said position measuring transducers coincides with a selected plane parallel to said plane comprising said X-direction and said Y-direction.

45. An apparatus as in claim 44 wherein said selected plane comprises a selected utilization plane location for said workpiece.

46. An apparatus as in claim 45 wherein a first retroreflector is fixedly mounted on a first portion of said free floating support means, a second retroreflector is fixedly mounted on a second portion of said free floating support means, and third retroreflector is fixedly mounted on a third portion of said free floating support means, and control means are operable for controlling movement of said stage means, said controlling means comprising:
first interferometer means, separated an optical distance W from said first retroreflector, for measuring changes in a first parameter associated with changes in said distance W and for providing a first signal corresponding to changes in said distance W;
second interferometer means, separated an optical distance U from said second retroreflector, for measuring changes in a second parameter associated with changes in said distance U and for providing a second signal corresponding to changes in said distance U;
third interferometer means, separated an optical distance V from said third retroreflector, for measuring changes in a third parameter associated with changes in said distance V and for providing a third signal corresponding to changes in said distance V;
transport means responsive to a first circuit means for moving said first, second, and third interferometer means to provide optical coupling between said first, second, and third interferometer means and said first, second, and third retroreflectors, respectively; and
second circuit means for causing said stage means to move to a preselected X-Y position and a preselected angular orientation, $\theta$, about said Z-direction in response to said first, second, and third signals.

47. An apparatus as in claim 46 wherein said three positioning sets are equally spaced at 120° at a radius R' from a selected axis oriented in said Z-direction with a first positioning set positioned in front, a second positioning set positioned to the left, and a third positioning set positioned to the right, signals representative of three distances, $Z_1'$, $Z_2'$ and $Z_3'$, to said chuck means from said first, second and third positioning sets, respectively, are transmitted to computer means, and wherein said first, second and third retroreflectors are located in a third plane, also parallel to said plane of motion, and spaced apart from said selected utilization plane location for said workpiece by a distance H', said apparatus further comprising:
use of said computer means for calculating Abbe offset errors in lateral positioning in said X- and Y-directions, $\delta X'$ and $\delta Y'$, of said workpiece, said Abbe offset errors being determined by a pitch angle, $\gamma'$, and a roll angle, $\phi'$, defined by $$\gamma' \simeq (Z_2' + Z_3' - Z_1')/3R' \text{ and}$$

$$\phi' \simeq (Z_2' - Z_3')/\sqrt{3}\ (R'),$$

where said Abbe offset errors are determined by $$\delta X' \simeq H'(\phi')$$

and $$\delta Y' \simeq H'(\gamma');$$

and use of said second circuit means for countermanding said Abbe offset errors in lateral positioning by moving said stage means by $-\delta X'$ and $-\delta Y'$ distances in said X- and Y-directions, respectively.

48. An X-Y-$\theta$ stage apparatus as in claim 46 wherein a fourth retroreflector is fixedly mounted underneath said second retroreflector and a fifth retroreflector is fixedly mounted underneath said third retroreflector, said apparatus further comprising:
  fourth interferometer means, separated an optical distance U' from said fourth retroreflector, for measuring changes in a fourth parameter associated with changes in said distance U' and for providing a fourth signal corresponding to changes in said distance U';
  fifth interferometer means, separated an optical distance V' from said fifth retroreflector, for measuring changes in a fifth parameter associated with changes in said distance V' and for providing a fifth signal corresponding to changes in said distance V';
  said transport means further responsive to said first circuit means for moving said fourth and fifth interferometer means to provide optical coupling between said fourth and fifth interferometer means and said fourth and fifth retroreflectors, respectively;
  said second circuit means further for modifying said distance U, said distance V, and said distance W to compensate for minute Abbe offset errors in said X- and Y-directions, due to minute rotations in the pitch and roll directions of said intermediate stage element and said stage caused by minute imperfections in support bearing reference surfaces of said base and said intermediate stage element, respectively.

49. An apparatus as in claim 48 wherein three positioning sets are equally spaced at 120° at a radius R' from a selected axis oriented in said Z-direction with a first positioning set positioned in front, a second positioning set positioned to the left, and a third positioning set positioned to the right, signals representative of three distances, $Z_1'$, $Z_2'$ and $Z_3'$ to said chuck means from said first, second and third positioning sets, respectively, are transmitted to computer means, and wherein said first, second and third retroreflectors are nominally located in a third plane, also parallel to said plane of motion, and spaced apart from said selected utilization plane location for said workpiece by a distance H', said computer being further used for calculating modifications, $\delta U$, $\delta V$ and $\delta W$, to said distances U, V and W, respectively, as determined by $$\delta U = (n_u/m)(U - U'),$$

$$\delta V = (n_v/m)(V - V')$$

and $$\delta W = \delta U(n_w/n_u)\sin(-\beta_u + \beta_w) + \delta V(n_w/n_v)\sin(-\beta_v - \beta_w),$$

where m is the vertical separation distance between said second and fourth, and third and fifth retroreflectors, respectively, $\beta_u$, $\beta_v$ and $\beta_w$ are selected angular orientations of said optical distances U and U', V and V', and W, respectively, $n_u$, $n_v$ and $n_w$ are the vertical separation distances between the actual locations of said second, third and first retroreflectors, respectively, and said selected utilization plane for said workpiece, said vertical separation distances being calculated according to $$n_u = H' + [(1.5R' + r')(Z_1' - Z_0') +$$

$$(r')(Z_2' + Z_3' - 2Z_0')/2]/1.5R',$$

$$n_v = H' + [(1.5R' + r')(Z_2' - Z_0') +$$

$$(r')(Z_3' + Z_1' - 2Z_0')/2]/1.5R'$$

and $$n_w = H' + [(1.5R' + r')(Z_3' - Z_0') +$$

$$(r')(Z_1' + Z_2' - 2Z_0')/2]/1.5R',$$

where $Z_0'$ is a reference value for said three distances, $Z_1'$, $Z_2'$ and $Z_3'$, to said chuck means from said first, second and third positioning sets, respectively, and r' is the radial distance between any of said first, second and third positioning sets, and said first, second and third retroreflectors, respectively, said modified final values, U", V" and W", of said U, V and W distances being determined by $$U'' = U - \delta U,$$

$$V'' = V - \delta V$$

and $$W'' = W - \delta W.$$

50. A method of achieving rotational alignment of a semiconductive wafer positioned on an apparatus having a stage guided and supported by an intermediate stage means, wherein said intermediate stage means is positioned in a Y-direction and a $\theta$-direction, about a Z-direction orthogonal to a plane of motion of said intermediate stage element and including said Y-direction, by a first Y-axis positioning element and a second Y-axis positioning element spaced apart by a distance L, comprising the steps of:
  a. positioning said first and second Y-axis positioning elements such that said $\theta$-direction orientation of said intermediate stage element is zero;
  b. load said semiconductive wafer on said stage of said apparatus;
  c. aligning a first alignment mark on a first side of said semiconductive wafer with a measurement standard, while keeping said $\theta$-direction orientation of said intermediate stage element at zero, the alignment position coordinates hereinafter called $X_d$ and $Y_d$;
  d. aligning a second alignment mark on a second side of the semiconductor wafer, opposite said first alignment mark in a nominal X-direction, said X-direction also being in said plane of motion, being orthogonal to said Y-direction and said Z-direction, on said semiconductive wafer, with said measurement standard, while keeping said $\theta$-direction orientation of said interminate stage element at zero, the alignment position coordinates hereinafter called $X_f$ and $Y_f$;
  e. calculating a new $\theta$-direction orientation of said intermediate stage element, $\theta$(new), defined by $$\theta(\text{new}) = \arctan (Y_f - Y_d)/(X_f - X_d);$$

f. calculating a differential value, $\Delta Y$, determined by $$\Delta Y = L \tan \theta(\text{new}),$$

where $$Y(\text{new}) = Y_1(\text{new}) - Y_2(\text{new}),$$

where $Y_1(\text{new})$ is a new Y-axis coordinate for said first Y-axis positioning element, and $Y_2(\text{new})$ is a new Y-axis coordinate for said second Y-axis positioning element; and g. moving said first and second Y-axis positioning elements to $Y_1(\text{new})$ and $Y_2(\text{new})$, respectively, to position said intermediate stage element at $\theta(\text{new})$.

51. A kinematic system for positioning a multi-axis stage apparatus within a utilization device such that an object mounted on said multi-axis stage apparatus is positioned coincident with a selected first plane, without lateral motion or rotation, relative to said utilization device, said system comprising:
   a base structure of said utilization device;
   three spaced drive means for supporting said multi-axis stage apparatus for translational movement along a first axis normal to a second plane of said base structure, parallel to said selected first plane, and for rotational movement about second and third axes orthogonal to the first axis and parallel to said second plane of the base structure; and
   constraining means, including the drive means, for kinematically constraining said multi-axis stage apparatus to move along the first axis and about the second and third axes and preclude lateral motion or rotation relative to said base structure at said selected first plane.

52. A kinematic system as in claim 51 wherein said constraining means comprise a mutually orthogonal set of three link members mounted coplaner with said selected first plane.

53. A kinematic system for positioning a multi-axis stage apparatus within a utilization device such that an object mounted on said multi-axis stage apparatus is positioned coincident with a selected first plane, without lateral motion or rotation, relative to said utilization device, said system comprising:
   a base structure of said utilizing device;
   three spaced drive means for supporting said multi-axis stage apparatus for translational movement along a selected first axis normal to a second plane of said base structure, parallel to said selected first plane, and for rotational movement about second and third axes orthogonal to the first axis and parallel to said second plane of the base structure, said three spaced drive means located equally spaced at 120° at a radius R from said selected first axis, with a first positioning set positioned in front, a second positioning set positioned to the left, and a third positioning set positioned to the right, and adapted for positioning said multi-axis stage apparatus at distances $Z_1$, $Z_2$ and $Z_3$, respectively from said second plane;
   position transducer means for transmitting signals representative of three distances $Z_1$, $Z_2$ and $Z_3$ to said chuck means from said first, second and third positioning sets, respectively, to computer means;
   constraining means, including the drive means, for kinematically constraining said multi-axis stage apparatus to move along said first axis and about said second and third axes and to preclude lateral motion in an X-direction or a Y-direction, orthogonal to one another and both orthogonal to said first axis, or rotation relative to said base structure at a third plane of said base structure, also parallel to said selected first plane, and spaced apart from said selected first plane by a distance H;
   use of said computer means for calculating Abbe offset errors in lateral positioning in said X- and Y-directions, $\delta X$ and $\delta Y$, of the multi-axis stage apparatus in said selected first plane, said Abbe offset errors being determined by a pitch angle, $\gamma$, and a roll angle, $\phi$, defined by $$\gamma \simeq (Z_2 + Z_3 - 2Z_1)/3R \text{ and}$$

$$\phi \simeq (Z_2 - Z_3)/\sqrt{3}\ (R),$$

where said Abbe offset errors are determined by $$\delta X \simeq H(\phi)$$

and $$\delta Y \simeq H(\gamma);$$

and control means for countermanding said Abbe offset errors in lateral positioning by moving a stage of said multi-axis stage apparatus by $-\delta X$ and $-\delta Y$ distances in said X- and Y-directions, respectively.

54. A kinematic system as in claim 53 wherein said constraining means comprise a mutually orthogonal set of three link members mounted coplaner with said third plane.

55. A method of achieving said coincident positioning of said multi-axis stage apparatus of claim 53, said method comprising the steps of:
   a. laterally positioning said multi-axis stage apparatus at a desired location;
   b. positioning said multi-axis stage assembly along said first axis and about said second and third axes as required;
   c. calculating said pitch and roll angles;
   d. calculating said Abbe offset errors; and
   e. moving said stage by said $-\delta X$ and $-\delta Y$ distances.

56. An X-Y-$\theta$ stage apparatus comprising:
   a base;
   an X-Y-$\theta$ stage assembly with workpiece holding means moveable along orthogonal X and Y axes and rotatable about an orthogonal third axis for moving said workpiece along said orthogonal X and Y axes and about said orthogonal third axis, said workpiece holding means having a first, second, and third retroreflector, with each retroreflector fixedly mounted thereto; and
   control means for controlling movement of said workpiece holding means, said controlling means comprising:
      first interferometer means, separated an optical distance W from said first retroreflector, for measuring changes in a first parameter associated with changes in said distance W and for providing a first signal corresponding to changes in said distance W;
      second interferometer means, separated an optical distance U from said second retroreflector, for measuring changes in a second parameter associated with changes in said distance U and for providing a second signal corresponding to changes in said distance U;

third interferometer means, separated an optical distance V from said third retroreflector, for measuring changes in a third parameter associated with changes in said distance V and for providing a third signal corresponding to changes in said distance V;

transport means responsive to a first circuit means for moving said first, second, and third interferometer means to provide optical coupling between said first, second, and third interferometer means and said first, second, and third retroreflectors, respectively; and second circuit means for causing said stage means to move to a preselected X-Y position and a preselected angular orientation, $\theta$, about said third axis in response to said first, second, and third signals.

57. An apparatus as in claim 56 wherein said workpiece holding means comprises chuck means, and wherein said chuck means is supported by free floating support means, said support means located with respect to six degrees of freedom by three positioning sets, each positioning set locating said free floating support means in two of said six degrees of freedom.

58. An apparatus as in claim 57 wherein each positioning set comprises two linear motors and two position measuring transducers, and further wherein a common measurement locus of said position measuring transducers coincides with a selected plane orthogonal to said third axis.

59. An apparatus as in claim 58 wherein said selected plane comprises a selected utilization plane location for said workpiece.

60. An apparatus as in claim 59 wherein said three positioning sets are equally spaced at 120° at a radius R' from said third axis with a first positioning set positioned in front, a second positioning set positioned to the left, and a third positioning set positioned to the right, signals representative of three distances $Z_1'$, $Z_2'$ and $Z_3'$ to said chuck means from said first, second and third positioning sets, respectively, are transmitted to computer means, and wherein said first, second and third retroreflectors are located in a second plane, orthogonal to said third axis, and spaced apart from said selected utilization plane location for said workpiece by a distance H', said apparatus further comprising:

use of said computer means for calculating Abbe offset errors in lateral positioning along said X and Y axes, $\delta X'$ and $\delta Y'$, of said workpiece, said Abbe offset errors being determined by a pitch angle, $\gamma'$, and a roll angle, $\phi'$, defined by $$\gamma' \simeq (Z_2' + Z_3' - Z_1')/3R' \text{ and}$$

$$\phi' \simeq (Z_2' - Z_3')/\sqrt{3}\ (R'),$$

where said Abbe offset errors are determined by $$\delta X' \simeq H'(\phi')$$

and $$\delta Y' \simeq H'(\gamma');$$

and use of said second circuit means for countermanding said Abbe offset errors in lateral positioning by moving said stage means $-\delta X'$ and $-\delta Y'$ distances along said X and Y axes, respectively.

61. An X-Y-$\theta$ stage apparatus as in claim 56 wherein a fourth retroreflector is fixedly mounted underneath said second retroreflector and a fifth retroreflector is fixedly mounted underneath said third retroreflector, said apparatus further comprising:

fourth interferometer means, separated an optical distance U' from said fourth retroreflector, for measuring changes in a fourth parameter associated with changes in said distance U' and for providing a fourth signal corresponding to changes in said distance U';

fifth interferometer means, separated an optical distance V' from said fifth retroreflector, for measuring changes in a fifth parameter associated with changes in said distance V' and for providing a fifth signal corresponding to changes in said distance V';

said transport means further responsive to said first circuit means for moving said fourth said fifth interferometer means to provide optical coupling between said fourth and fifth interferometer means and said fourth and fifth retroreflectors, respectively;

said second circuit means further for modifying said distance U, said distance V, and said distance W to compensate for minute Abbe offset errors in said X- and Y-directions, due to minute rotations in the pitch and roll directions of said workpiece holding means.

62. An apparatus as in claim 61 wherein said second circuit means further comprises a computer for calculating modifications, $\delta U$, $\delta V$ and $\delta W$, to said distances U, V and W, respectively, as determined by $$\delta U = (n_u/m)(U - U'),$$

$$\delta V = (n_v/m)(V - V')$$

and $$\delta W = \delta U(n_w/n_u)\sin(-\beta_u + \beta_w) + \delta V(n_w/n_v)\sin(-\beta_v - \beta_w),$$

where m is the vertical separation distance between said second and fourth, and third and fifth retroreflectors, respectively, $\beta_u$, $\beta_v$ and $\beta_w$ are selected angular orientations of said optical distances U and U', V and V', and W, respectively, $n_u$, $n_v$ and $n_w$ are the vertical separation distances between said second, third and first retroreflectors, respectively, and a selected plane of said workpiece, said modified final values, U'', V'' and W''', of said U, V and W distances being determined by $$U'' = U - \delta U,$$

$$V'' = V - \delta V$$

and $$W'' = W - \delta W.$$

* * * * *